US012724945B2

(12) United States Patent
Inoue et al.

(10) Patent No.: US 12,724,945 B2

(45) Date of Patent: Sep. 1, 2026

(54) LAYOUT METHOD FOR AUTOMATICALLY GENERATING CIRCUIT LAYOUT AND CONTROL SYSTEM FOR CONTROLLING LAYOUT ARRANGEMENT OF CIRCUIT GENERATED OVER SUBSTRATE

(71) Applicant: SEMICONDUCTOR ENERGY LABORATORY CO., LTD., Atsugi (JP)

(72) Inventors: Seiko Inoue, Atsugi (JP); Ryo Nakazato, Ebina (JP); Takahiro Fukutome, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 1056 days.

(21) Appl. No.: 17/776,054

(22) PCT Filed: Nov. 4, 2020

(86) PCT No.: PCT/IB2020/060332

§ 371 (c)(1),
(2) Date: May 11, 2022

(87) PCT Pub. No.: WO2021/094873

PCT Pub. Date: May 20, 2021

(65) Prior Publication Data

US 2022/0382937 A1 Dec. 1, 2022

(30) Foreign Application Priority Data

Nov. 15, 2019 (JP) ................................. 2019-207249

(51) Int. Cl.
*G06F 30/27* (2020.01)
*G06F 30/398* (2020.01)

(52) U.S. Cl.
CPC ............ *G06F 30/27* (2020.01); *G06F 30/398* (2020.01)

(58) Field of Classification Search
CPC ........ G06F 30/27; G06F 30/39; G06F 30/392; G06F 30/398; G06F 30/394; H10D 89/10; G06N 3/06; G06N 3/08; G06N 3/098
(Continued)

(56) References Cited

U.S. PATENT DOCUMENTS 7,873,585 B2 1/2011 Izikson
8,239,803 B2 8/2012 Kobayashi
(Continued)

FOREIGN PATENT DOCUMENTS

JP 2002-343865 A 11/2002
JP 2004-014798 A 1/2004
(Continued)

OTHER PUBLICATIONS

International Search Report (Application No. PCT/IB2020/060332), dated Feb. 9, 2021.
(Continued)

*Primary Examiner* — Paul Dinh
(74) *Attorney, Agent, or Firm* — Fish & Richardson P.C.

(57) ABSTRACT

A novel circuit layout method is provided. In a circuit including a first terminal, a second terminal, a third terminal, a fourth terminal, a first wiring, and a second wiring, the layout method includes a step of generating a layout of connecting the first terminal and the third terminal using the first wiring; a step of generating a layout of connecting the second terminal and the fourth terminal using the second wiring; a step of calculating a first wiring resistance of the first wiring; a step of calculating a second wiring resistance of the second wiring; and a step of automatically generating the layouts of the first wiring and the second wiring in the
(Continued)

circuit so that the first wiring resistance can be equal to the second wiring resistance.

10 Claims, 12 Drawing Sheets

(58) Field of Classification Search
USPC .......................................................... 716/110
See application file for complete search history.

(56) References Cited

U.S. PATENT DOCUMENTS

| | | | | |
|---|---|---|---|---|
| 10,949,595 | B2 | 3/2021 | Tsutsui et al. | |
| 2008/0301609 | A1 | 12/2008 | Perez | |
| 2009/0222781 | A1 | 9/2009 | Hamazaki | |
| 2020/0103761 | A1 * | 4/2020 | Ypma | G03F 7/706841 |
| 2022/0026810 | A1 * | 1/2022 | Brantjes | G03F 9/7046 |

FOREIGN PATENT DOCUMENTS

| | | | |
|---|---|---|---|
| JP | 2004-086509 | A | 3/2004 |
| JP | 2009-065056 | A | 3/2009 |
| JP | 2009-206330 | A | 9/2009 |
| JP | 2010-538474 | | 12/2010 |
| JP | 2011-216554 | A | 10/2011 |
| JP | 2013-239668 | A | 11/2013 |
| WO | WO-2009/029851 | | 3/2009 |
| WO | WO-2018/234945 | | 12/2018 |

OTHER PUBLICATIONS

Written Opinion (Application No. PCT/IB2020/060332), dated Feb. 9, 2021.

Matsumoto.T et al., “Evaluation of semiconductor packaging process by low-k TEG wafer”, Proceedings of the 19th Microelectronics Symposium, 2009, p. 4pages.

* cited by examiner

FIG. 3

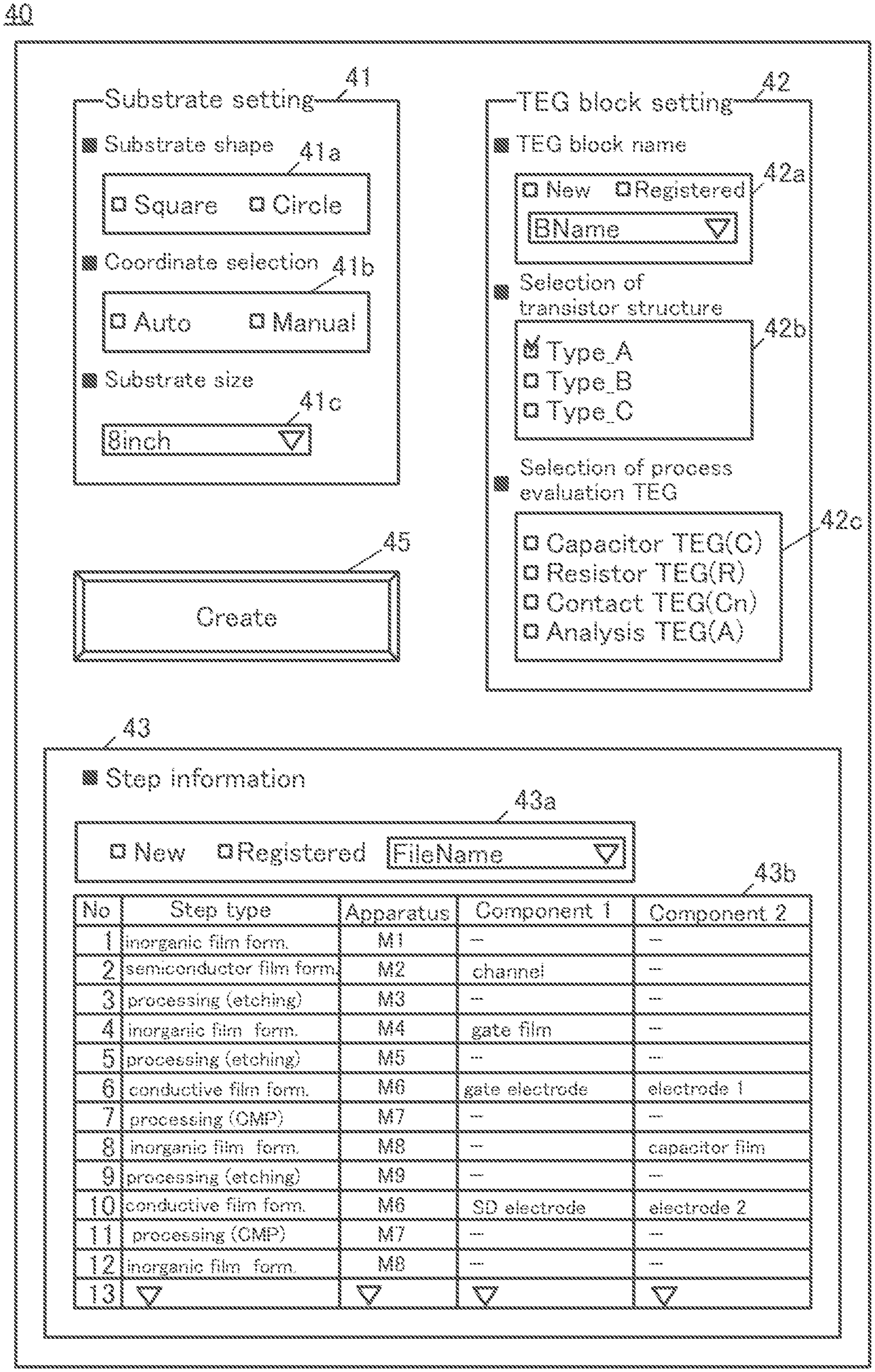

| No | Step type | Apparatus | Component 1 | Component 2 |
|---|---|---|---|---|
| 1 | inorganic film form. | M1 | — | — |
| 2 | semiconductor film form. | M2 | channel | — |
| 3 | processing (etching) | M3 | — | — |
| 4 | inorganic film form. | M4 | gate film | — |
| 5 | processing (etching) | M5 | — | — |
| 6 | conductive film form. | M6 | gate electrode | electrode 1 |
| 7 | processing (CMP) | M7 | — | — |
| 8 | inorganic film form. | M8 | — | capacitor film |
| 9 | processing (etching) | M9 | — | — |
| 10 | conductive film form. | M6 | SD electrode | electrode 2 |
| 11 | processing (CMP) | M7 | — | — |
| 12 | inorganic film form. | M8 | — | — |
| 13 | ▽ | ▽ | ▽ | ▽ |

FIG. 9

LAYOUT METHOD FOR AUTOMATICALLY GENERATING CIRCUIT LAYOUT AND CONTROL SYSTEM FOR CONTROLLING LAYOUT ARRANGEMENT OF CIRCUIT GENERATED OVER SUBSTRATE

CROSS REFERENCE TO RELATED APPLICATIONS

This application is a U.S. National Phase Application under 35 U.S.C. § 371 of International Application PCT/IB2020/060332, filed on Nov. 4, 2020, which is incorporated by reference and claims the benefit of a foreign priority application filed in Japan on Nov. 15, 2019, as Application No. 2019-207249.

TECHNICAL FIELD

One embodiment of the present invention relates to a system for controlling a circuit layout using a computer. One embodiment of the present invention relates to a layout method for automatically generating a circuit layout. Another embodiment of the present invention relates to a layout method for automatically arranging, on a substrate, a circuit layout for evaluating a semiconductor element. Another embodiment of the present invention relates to a method for generating a circuit block that automatically generates a layout in which a plurality of circuits for evaluating a variation in a manufacturing apparatus are regarded as a circuit block. Another embodiment of the present invention relates to a learning model which learns variation information of a manufacturing apparatus for manufacturing a semiconductor element. Another embodiment of the present invention relates to a control system in which a learning model arranges a layout of a circuit block on a substrate in accordance with the kind of circuits included in the circuit block.

Note that the above-described circuit includes a functional circuit to which a function is added by a plurality of semiconductor elements and a TEG (Test Element Group). Thus, in the description of this specification and the like, a TEG can be replaced with a functional circuit or a circuit.

Note that the semiconductor element in this specification and the like refers to an element that can operate by utilizing semiconductor characteristics. Examples of the semiconductor element include a transistor, a diode, a light-emitting element, a light-receiving element, and the like. Other examples of the semiconductor element are passive elements such as a capacitor, a resistor, and an inductor, which are formed using a conductive film, an insulating film, or the like. Other examples of the semiconductor element include a semiconductor device including a circuit including a semiconductor element or a passive element.

BACKGROUND ART

In recent years, process shrink has been promoted in development of semiconductor devices. One of reasons of promotion in process shrink is that low power consumption due to lower voltage and operation at a high-frequency band are desired for semiconductor devices. A semiconductor device includes various semiconductor elements, and a variation of characteristics in semiconductor elements might narrow the operation range and reduce reliability of a semiconductor device. In particular, in the development of a novel process for miniaturization, it is important to accurately evaluate variations in characteristics between substrates and variations in characteristics within a substrate. Furthermore, in an analog circuit, a variation in characteristics of a semiconductor element greatly affects a circuit operation. Therefore, in the novel process development, evaluation of characteristics using a TEG is important and a design of a TEG with which variations in characteristics within a substrate can be accurately evaluated is desired.

Note that the variation between substrates means a variation range of semiconductor elements between substrates. The variation in a substrate means a variation range of a plurality of semiconductor elements formed in a substrate. Note that in this specification and the like, the variation in a substrate may be expressed as an in-plane variation. Furthermore, a variation between semiconductor elements which is affected by a variation in a manufacturing apparatus includes electrical characteristics, shape, reliability, and the like.

Patent Document 1 discloses a layout method of a semiconductor integrated circuit.

REFERENCE

Patent Document

[Patent Document 1] Japanese Published Patent Application No. 2009-65056

SUMMARY OF THE INVENTION

Problems to be Solved by the Invention

The process design, the device design, and the circuit design are necessary to develop a semiconductor element. For example, in formation of a semiconductor element, the semiconductor element is formed by combination of a plurality of manufacturing steps. There is a problem that electric characteristics of the semiconductor element vary when the order of manufacturing steps is changed. There is also a problem that a different manufacturing apparatus or different process conditions would cause a variation of electric characteristics between semiconductor elements formed even through the same steps.

There is a problem for semiconductor elements that even when the same process conditions are set in different manufacturing apparatuses having the same process and the same function, formed semiconductor elements might have different electrical characteristics depending on the state of the manufacturing apparatuses. Note that the state of the manufacturing apparatus means that a variation just after the maintenance of a manufacturing apparatus is different from a variation in a substrate processed after a plurality of treatments are performed using the manufacturing apparatus, for example. Therefore, there is a problem that a variation in a manufacturing apparatus may affect a variation between semiconductor elements. Thus, in order to evaluate a variation between semiconductor elements, the state of each manufacturing apparatus for manufacturing semiconductor elements should be extracted independently.

In order to do that, there is a problem that a TEG for evaluating a variation of each manufacturing apparatus needs to be prepared. There is a problem that different pieces of information are necessary for the process design, device design, or circuit design. In addition, in the case where the arrangement of a TEG in a substrate does not include consideration of an (in-plane) variation in the substrate, there is a problem that necessary information cannot obtained from an evaluated TEG.

The recent mainstream of manufacturing a semiconductor element is a stack process. Therefore, there is a problem that in the design of a TEG, design failure may occur due to a manual TEG layout operation. Therefore, an efficient layout design using an EDA (Electronic Design Automation) tool or automatic layout is desired. On the other hand, in order to accurately evaluate a variation of the manufacturing apparatus on the basis of a variation between semiconductor elements as described above, a knowledge of process, a knowledge of device, and a knowledge of circuit are also necessary. For an automatic layout in which components are simply arranged and interconnected with each other, there is a problem that it is difficult to accurately evaluate a variation between semiconductor elements.

In view of the above problems, an object of one embodiment of the present invention is to provide a control system that controls a circuit layout using a computer. An object of one embodiment of the present invention is to provide a layout method for automatically generating a circuit layout. Another object of one embodiment of the present invention is to provide a layout method for automatically arranging, on a substrate, a circuit layout for evaluating a semiconductor element. Another object of one embodiment of the present invention is to provide a method for generating a circuit block that automatically generates a layout in which a plurality of circuits for evaluating a variation in a manufacturing apparatus are regarded as a circuit block. Another object of one embodiment of the present invention is to provide a learning model which learns variation information of a manufacturing apparatus for manufacturing semiconductor elements. Another embodiment of the present invention is to provide a control system in which a learning model arranges a layout of a circuit block on a substrate in accordance with the kind of circuits included in the circuit block.

Note that the description of these objects does not preclude the existence of other objects. One embodiment of the present invention does not have to achieve all these objects. Other objects will be apparent from the description of the specification, the drawings, the claims, and the like, and other objects can be derived from the description of the specification, the drawings, the claims, and the like.

Means for Solving the Problems

A control system according to one embodiment of the present invention functions as a TEG control system. The TEG control system automatically generates a layout of a TEG with a program stored in a memory device.

One embodiment of the present invention is a layout method including, in a circuit (TEG) including a first terminal, a second terminal, a third terminal, a fourth terminal, a first wiring, and a second wiring, a step of generating a layout of connecting the first terminal and the third terminal using the first wiring; a step of generating a layout of connecting the second terminal and the fourth terminal using the second wiring; a step of calculating a first wiring resistance of the first wiring; a step of calculating a second wiring resistance of the second wiring; and a step of automatically generating the layouts of the first wiring and the second wiring in the circuit so that the first wiring resistance is equal to the second wiring resistance.

Preferably, the first terminal and the second terminal are measurement terminals and the third terminal and the fourth terminal are terminals of a semiconductor element included in the circuit.

In the above structure, the circuit further includes a third wiring, and the layout method includes a step of generating a layout of connecting the first terminal and the third terminal using the third wiring including a contact; a step of calculating a third wiring resistance of the third wiring; a step of varying the first wiring resistance by changing a shape or a positional layout of the first wiring so that the first wiring resistance is equal to the third wiring resistance; and a step of automatically generating the layout of the first wiring and the third wiring of the circuit so that the first wiring resistance is equal to the third wiring resistance.

One embodiment of the present invention is a control system of automatically arranging a layout of a TEG block on a substrate. The control system includes a learning model, and a step in which the learning model learns measurement data including an in-plane distribution of a manufacturing apparatus used for forming a semiconductor element included in a TEG, and the TEG layout generated by the layout method is given to the learning model, the control system includes a step in which the learning model automatically arranges the TEG layout on the substrate.

Effect of the Invention

According to one embodiment of the present invention, a control system that controls a circuit layout using a computer can be provided. According to one embodiment of the present invention, a layout method for automatically generating a circuit layout can be provided. According to another embodiment of the present invention, a layout method for automatically arranging, on a substrate, a circuit layout for evaluating a semiconductor element can be provided. According to another embodiment of the present invention, a method for generating a circuit block that automatically generates a layout in which a plurality of circuits for evaluating a variation in a manufacturing apparatus are regarded as a circuit block can be provided. According to another embodiment of the present invention, a learning model which learns variation information of a manufacturing apparatus for manufacturing semiconductor elements can be provided. According to another embodiment of the present invention, a control system in which a learning model arranges a layout of a circuit block on a substrate in accordance with the kind of circuits included in the circuit block can be provided.

Note that the effects of one embodiment of the present invention are not limited to the effects listed above. The effects listed above do not preclude the existence of other effects. Note that the other effects are effects that are not described in this section and will be described below. The effects that are not described in this section are derived from the descriptions of the specification, the drawings, and the like and can be derived from these descriptions by those skilled in the art. Note that one embodiment of the present invention has at least one of the effects listed above and/or the other effects. Accordingly, depending on the case, one embodiment of the present invention does not have the effects listed above in some cases.

BRIEF DESCRIPTION OF THE DRAWINGS

FIG. 3 is a diagram illustrating a TEG setting screen.

FIG. 9 is a flowchart illustrating a method for arranging a TEG block.

MODE FOR CARRYING OUT THE INVENTION

Figure 1:
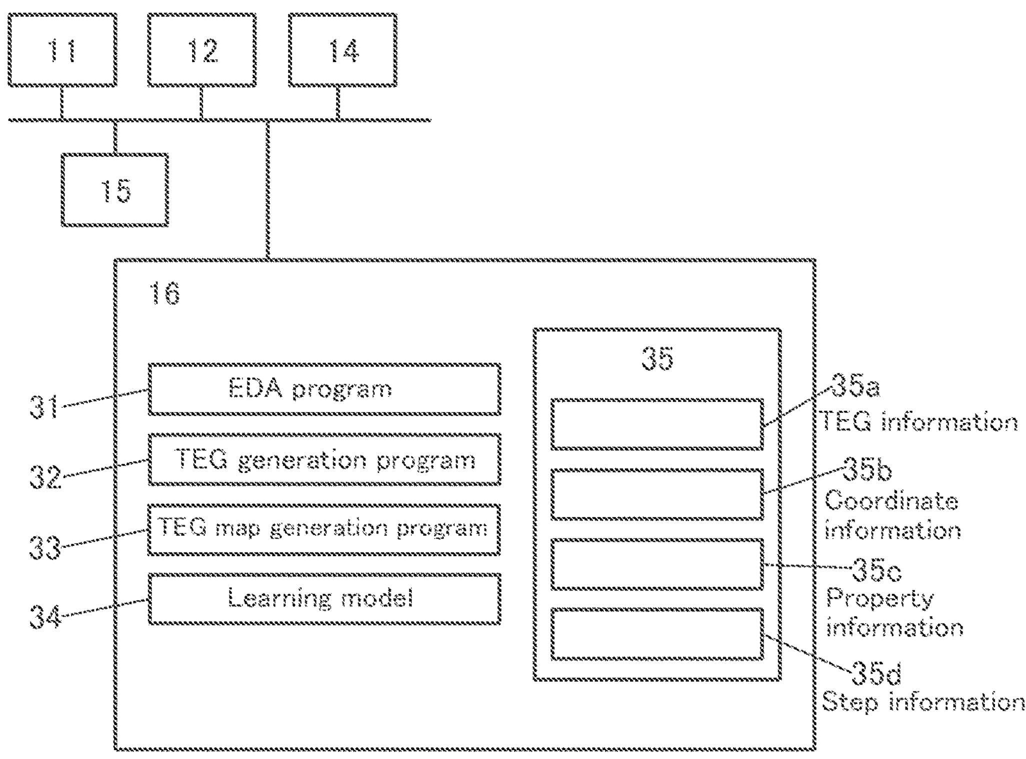
FIG. 1 is a diagram illustrating a computer included in a TEG control system.

Embodiments are described in detail with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description of embodiments below.

Note that in structures of the invention described below, the same portions or portions having similar functions are denoted by the same reference numerals in different drawings, and a description thereof is not repeated. Furthermore, the same hatch pattern is used for the portions having similar functions, and the portions are not especially denoted by reference numerals in some cases.

In addition, the position, size, range, or the like of each structure illustrated in drawings does not represent the actual position, size, range, or the like in some cases for easy understanding. Therefore, the disclosed invention is not necessarily limited to the position, size, range, or the like disclosed in the drawings.

Furthermore, ordinal numbers such as "first," "second," and "third" used in this specification and the like are used in order to avoid confusion among components, and the terms do not limit the components numerically.

EMBODIMENT

This embodiment will describe a layout method for automatically generating a layout of a TEG, and a control system that controls arrangement of a circuit layout formed on a substrate, using a computer.

First, a TEG will be described. A TEG is used for development of a semiconductor element (or a circuit) formed on a substrate and the control of a manufacturing apparatus. In other words, the TEG is an evaluation element (or an evaluation circuit) for detecting a problem in a manufacturing process or a problem in a design process. A transistor, one of semiconductor elements, is known to be formed through a plurality of manufacturing steps, as an example. Examples of manufacturing steps for forming a transistor shape include a film-formation step and a processing step. The processing steps further include a patterning step, an etching step, and the like. The manufacturing steps of a transistor include an impurity addition step, a heating step, and the like; however, description thereof is omitted in one embodiment of the present invention.

Examples of the film-formation step include a formation step of a semiconductor film, a formation step of an insulating film, and a formation step of a conductive film. In addition, examples of the processing step include a patterning step of transferring shapes of a semiconductor film, an insulating film, and a conductive film, and a processing step of processing a patterned film into a size of the pattern. Through the repetition of the film-formation step and the processing step, the semiconductor element is formed into a transistor shape. Note that a variation or the like in a film thickness or a film quality of a semiconductor film, an insulating film, a conductive film, and the like is caused by a film-formation apparatus used in a film-formation process.

Note that a channel of a transistor is formed in a semiconductor film; therefore, uniformity of a film thickness, a film quality, and the like in a substrate affects a variation in the electrical characteristics of a plurality of transistors formed over the same substrate. Furthermore, a film thickness, a film quality, and the like of an insulating film formed between a semiconductor film and a conductive film affect electrical characteristics of transistors. In addition, a conductive film is preferably a film with high conductivity so as to form a gate, a source, and a drain of a transistor. In addition, to process shapes of a semiconductor film, an insulating film, and a conductive film, different processing steps suitable for their film qualities are needed. Therefore, a plurality of manufacturing steps are needed to form transistors. Note that each manufacturing step includes a processing variation in a manufacturing apparatus. One embodiment of the present invention is a layout method for generating a layout of a plurality of TEGs for correctly evaluating a variation in electrical characteristics of transistors and for generating a layout of a TEG block including the plurality of TEGs.

A layout of a TEG including transistors will be described as an example. The TEG includes a layout of first to fourth terminals, a transistor, and first to fourth wirings. The first to fourth terminals correspond to measurement terminals. Note that the number of measurement terminals can be changed depending on a semiconductor element or a circuit which is an evaluation target. In another example, in a layout including a capacitor, the first terminal and the second terminal correspond to measurement terminals.

Here, description is made using an example where a semiconductor element included in a TEG is a transistor. In order to correctly evaluate the electrical characteristics of the transistor, it is necessary to electrically connect a gate, a drain, and a source of the transistor to a measurement device through the first to third terminals. In the case where the transistor includes a back gate, the back gate is electrically connected to the measurement device through the fourth terminal.

For example, the TEG has a layout in which the first terminal is connected to one of the source and the drain of the transistor through the first wiring, the second terminal is connected to the other of the source and the drain of the transistor through the second wiring, and the third terminal is connected to the gate of the transistor through the third wiring. In the case where the TEG includes a back gate, the fourth terminal is connected to the back gate of the transistor through the fourth wiring in the layout.

In order to correctly evaluate the electrical characteristics of the transistor, it is preferable to correctly apply a voltage or a current, which is the measurement condition, to each terminal of the transistor. Therefore, description is made in this embodiment, focusing on wirings between the measurement terminals and the terminals of the semiconductor element. Note that the wirings each have a wiring resistance.

For example, in the case where the semiconductor element is a transistor, a source and a drain are terminals through which current flows, and a gate and a back gate are terminals through which current does not flow. Even with the terminals through which current does not flow, a short circuit between terminals due to a defective shape or a leakage current through an insulating film is evaluated in some cases. Thus, it is preferable that the gate or the back gate be treated like the terminals through which current flows.

With shrinking of the design rule of the transistor, the design rule of a wiring is required to be shrunk. However, as a wiring is thinner, the wiring resistance is increased. Therefore, the magnitude of wiring resistance greatly affects evaluation of the electrical characteristics of a transistor formed through a miniaturization process.

For example, when the wiring resistance is increased, a voltage drop occurs due to the wiring resistance and a voltage different from a voltage applied to measurement terminals is applied to a source or a drain of a transistor. In the case where the wiring resistances of the first wiring and the second wiring are different, it is difficult to know which a variation of a transistor or a voltage drop due to the wiring resistance have affected the measurement result of current. In addition, in the case where different electrical characteristics are exhibited in the measurement when a source and a drain of a transistor are interchanged, it is difficult to know which a transistor or the wiring resistance of the first wiring or the second wiring could cause the different electrical characteristics.

Thus, the first wiring and the second wiring are preferably laid out such that the wiring resistances of the first wiring and the second wiring can be equal. Since the wiring resistances of the first wiring and the second wiring can be equal, the electrical characteristics of a semiconductor element including a transistor can be evaluated precisely. Accordingly, the evaluation of a TEG facilitates findings of a problem in manufacturing or designing. Note that the third wiring and the fourth wiring are preferably laid out such that the wiring resistances of the third wiring and the fourth wiring can be equal.

In the TEG control system that is one embodiment of the present invention, the layout of a TEG is automatically generated by a TEG generation program which is stored in a memory device. In the layout method of the TEG control system, a plurality of resistor blocks are combined so that measurement terminals and terminals of a semiconductor element are connected to each other. In the case where the semiconductor element is a transistor, the transistor includes one terminal of a source and a drain, the other of the source and the drain, and a gate terminal.

The TEG generation program includes a step of generating a layout in which a first terminal is connected to one terminal of a source and a drain of a transistor through a first wiring. The TEG generation program includes a step of generating a layout in which a second terminal is connected to the other terminal of the source and the drain of the transistor through a second wiring.

The first wiring and the second wiring have a layout of a first wiring block and a layout of a second wiring block. Note that in one embodiment of the present invention, a first resistance value is calculated from a layout of the first wiring block and a second resistance value is calculated from a layout of the second wiring block. Therefore, the layout of the first wiring block and the layout of the second wiring block that form the first wiring can be regarded as the first wiring resistance obtained by addition of the first resistance value and the second resistance value. Furthermore, the layout of the first wiring block and the layout of the second wiring block that form the second wiring can be regarded as the second wiring resistance obtained by addition of the first resistance value and the second resistance value.

The TEG generation program automatically generates a layout of a TEG so that the first wiring resistance and the second wiring resistance are equal to each other. A layout is generated so that the first wiring resistance can be equal to the second wiring resistance, whereby the wiring resistance included in the TEG can less affect electric characteristics. Note that the first wiring resistance and the second wiring resistance can be set to have designated resistance values. For example, the impedance of the first wiring resistance and the second wiring resistance can be set to 50Ω.

As described above, the layout method using the TEG generation program can be used for generating a TEG layout for evaluating a variety of semiconductor elements. For example, in the case of evaluating transistors, a plurality of TEGs for evaluating transistors are preferably provided. Examples of the TEG for controlling electrical characteristics of transistors include a resistor TEG that controls a resistance value of a semiconductor film of a transistor, a capacitor TEG that controls a film thickness or a film quality of an insulating film, a resistor TEG that controls a resistance value of a conductive film used for a source, a drain, a gate, or the like of a transistor, a contact TEG that connects different conductive layers, and a TEG having different channel lengths or channel widths of transistors. The TEG generation program can generate a layout in which the above-described plurality of kinds of TEGs are a TEG block.

The TEG block can include a layout of an analysis TEG, such as a TDS evaluation TEG for evaluating a film quality or the like using a thermal desorption spectroscopy method (TDS) or a SIMS evaluation TEG for evaluating a film quality using a secondary ion mass spectrometry (SIMS) method. By evaluation using a TEG block, a cause of a variation in electrical characteristics of transistors, a problem in a manufacturing process, and a problem in a design process can be easily found.

Note that the TEG block is needed to be arranged at an appropriate position in a substrate and in an appropriate number for evaluating a variation in a substrate. The variation in a substrate is affected by manufacturing apparatuses used in manufacturing steps. Thus, the TEG control system preferably includes a learning model for arranging an appropriate number of TEG blocks in an appropriate position in a substrate. The learning model can learn an in-plane distribution in a manufacturing apparatus used for forming a TEG. A TEG or TEG block generated by a layout method is added to the learning model, whereby the learning model can automatically arrange a TEG on a substrate. Moreover, the TEG control system can generate a measurement recipe for measuring electrical characteristics of TEGs that are automatically arranged on a substrate.

Next, a layout method for automatically generating a circuit layout and a control system that controls the arrangement of the circuit layout formed on a substrate are described with reference to FIG. 1 to FIG. 11.

FIG. 1 is a diagram illustrating a computer included in the TEG control system. A computer 10 includes a processor 11, a memory device 12, a GPU (Graphics Processing Unit) 14, an input/output device 15, and a memory device 16. The input/output device 15 includes a display device, a touch panel, a keyboard, a mouse, and the like. The memory device 16 includes an EDA program 31, a TEG generation program 32, a TEG map generation program 33, and a learning model 34, and further includes a database 35. Note that the above-described programs can perform arithmetic processing or the like in the TEG control system, using the processor 11 and the GPU 14. Furthermore, the processor 11 or the GPU 14 can use the memory device 12 as a cache memory. The database 35 includes TEG information 35*a*, coordinate information 35*b*, property information 35*c*, step information 35*d*, and the like.

As the TEG information 35*a*, a feasible basic layout of a transistor and basic layout information of a process control element (e.g., a capacitor TEG, a resistor TEG, a Kelvin-connected resistor TEG or the like, a sheet resistor TEG, a contact TEG, a coverage and short TEG, an open and short TEG, or an analysis TEG) are stored. In addition, a circuit TEG for evaluating a basic circuit operation (a ring oscillator circuit, a shift register circuit, or a combination circuit) or the like can be included. Note that measurement terminal information and information regarding a TEG size are preferably tied with and stored in each piece of TEG information 35*a*.

Note that a new transistor structure, layout, and step information can be registered as the TEG information 35*a*. In registering a new transistor structure, a design rule relating to the novel transistor is preferably stored in association with the new transistor structure.

As the coordinate information 35*b*, the size of a substrate, the shape (quadrangle or circle) of the substrate, an implementable region, the number of mounted TEG blocks, and the like can be stored.

As the property information 35*c*, measurement data and the like obtained in the past are stored. The learning model can learn an in-plane variation of each of manufacturing apparatuses used in a manufacturing process, with measurement data included in the property information 35*c*.

As the step information 35*d*, step information that can be used for a semiconductor element and a circuit can be stored. The step information 35*d* is preferably associated with the property information 35*c*.

The EDA program 31 is software for supporting a design operation of a layout of a semiconductor element, a circuit, and the like. The TEG control system instructs the EDA program 31 to generate a layout of a target TEG. Note that the TEG control system of one embodiment of the present invention may be included in the EDA program 31. When the EDA program 31 includes the TEG control system, it is easy to automatically generate the layout of the TEG.

The TEG generation program 32 can automatically generate the layout of the TEG with use of the TEG information 35*a*, the coordinate information 35*b*, and the step information 35*d*. Note that the TEG generation program 32 may instruct the EDA program 31 to generate the layout of the TEG. The TEG generation program 32 will be described in detail with reference to FIG. 5 to FIG. 8.

The TEG map generation program 33 automatically arranges TEGs that are automatically generated by the TEG generation program 32 on a designated substrate to automatically generate a TEG map. The TEG map generation program 33 can generate a measurement recipe. The TEG map generation program 33 will be described with reference to FIG. 4 or FIG. 9 in detail.

The learning model 34 includes a neural network, and the learning model 34 learns measurement data included in the property information 35*c* with use of the GPU 14. Note that layout information of the generated TEG or TEG block is given to the learning model 34, whereby the learning model 34 can judge content of the TEG or TEG block and generate and output a TEG block map suitable for evaluation of a manufacturing step.

Figure 2:
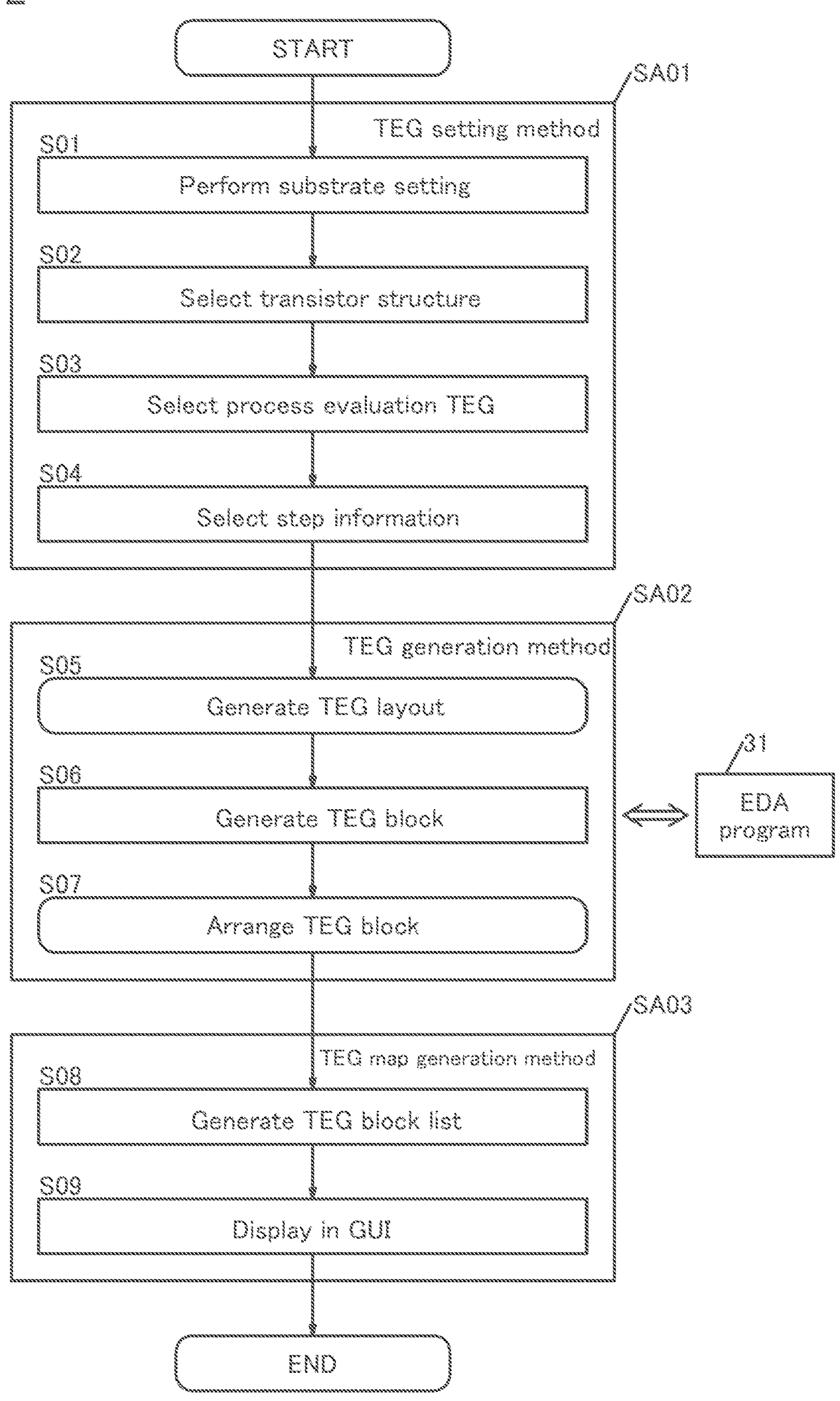
FIG. 2 is a flowchart illustrating a TEG control system.

FIG. 2 is a flowchart illustrating the TEG control system. The functions of the TEG control system can be separated into a TEG setting method SA01, a TEG generation method SA02, and a TEG map generation method SA03.

The TEG setting method SA01 will be described first. Step S01 is a step of performing substrate setting. In the substrate setting, a substrate shape, coordinate selection, and a substrate size can be set.

Step S02 is a step of selecting a transistor structure.

Step S03 is a step of selecting a process evaluation TEG. As the process evaluation TEG, a capacitor TEG, a resistor TEG, a contact TEG, and an analysis TEG are given.

Step S04 is a step of selecting step information. Step information can be selected from the step information 35*d* stored in the database 35. For example, in the step information 35*d*, a step of forming a transistor is stored. Note that new step information can be added to the step information 35*d*. Examples of the step information are described in detail with reference to FIG. 3.

Next, the TEG generation method SA02 is described. Step S05 is a step of generating a layout of a plurality of TEGs associated with a selected transistor. The TEG generation program 32 instructs the EDA program 31 to automatically generate a TEG layout for a selected transistor structure and the process evaluation TEG relating to the transistor structure. Note that the method for generating the layout will be described in detail with reference to FIG. 5 to FIG. 8.

Step S06 is a step of generating a TEG block. As for the TEG block, the plurality of TEGs generated in Step S05 can be regarded as one TEG block and have a name of the TEG block. The TEG map generation program 33 can generate a layout of a TEG block by automatically arranging a plurality of TEGs. Alternatively, as for the layout of the TEG block, a user may specify positions of TEGs to arrange the TEGs. Note that a name of a TEG block that is already registered can be used as the name of the TEG block. Alternatively, a new name of a TEG block can be added.

Step S07 is a step pf arranging TEG blocks on the substrate using the learning model 34. The learning model 34 learns using data of an in-plane distribution (electric, film thickness, film quality, or the like) in a manufacturing apparatus which is already stored in the database 35. Accordingly, the TEG block is given as inference data to the learning model, so that the learning model can judge which position in a substrate is suitable for TEG block arrangement to comprehend an in-plane distribution of the substrate, and output the position.

Next, the TEG map generation method SA03 is described. Step S08 is a step of generating a TEG block list. The TEG block list is a method for listing TEGs included in the TEG block as one unit. The kinds of TEGs included in the TEG block are generated as a TEG list.

Step S09 is a step of displaying the TEG block map and the TEG block list in a GUI (Graphical User Interface). In the GUI, the TEG block list and the TEG block map are displayed, and the TEG list and the TEG map included in the TEG block are displayed. Any one of the TEG block list and the TEG list is selected and the selected TEG block or TEG is highlighted. Thus, which position in the substrate the TGE is arranged at can be shown. Note that a measurement recipe can be generated from the TEG map and the TEG list displayed in the GUI.

FIG. 3 is a view illustrating a screen of TEG setting. A TEG setting screen 40 includes substrate setting 41, TEG block setting 42, step information 43, and a TEG generation button 45.

The substrate setting 41 includes a selection column 41*a* of a substrate shape, a selection column 41*b* of coordinate selection, a selection column 41*c* of a substrate size, and the like. In the selection column 41*a* of the substrate shape, any one of "quadrangle" and "circle" can be selected as the substrate shape, for example. In the selection column 41*b* of coordinate selection, "auto" or "manual" can be selected. The coordinate selection means that the arrangement of a TEG block described later is made in a desired position automatically by the TEG map generation program 33 or manually. With the selection column 41*c* of the substrate size, the size of a substrate in which TEGs are arranged can be selected. Although FIG. 3 illustrates an example in which "8 inch" is selected, one embodiment of the present invention is not limited to this example, and the substrate size can be selected from a plurality of options.

The TEG block setting 42 includes a register column 42*a* of a TEG block name, a selection column 42*b* of a transistor structure, a selection column 42*c* of a process evaluation TEG, and the like. In the register column 42*a* of the TEG block name, any one of "new" and "registered" can be selected as the TEG block name. In the case where a registered TEG block name is selected, information of registered TEG blocks can be read. When addition, elimination, or the like is performed on a TEG block associated with a registered TEG block name, information of the TEG block can be registered with a different name.

With the selection column 42*b* of a transistor structure, a transistor structure can be selected. FIG. 3 illustrates an example in which "Type_A", "Type_B", or "Type_C" can be selected; however, the number of transistor structures to be selected and the options are not limited thereto. The transistor structure is associated with the step information 43 described later.

In the selection column 42*c* of the process evaluation TEG, a TEG can be selected, which can independently evaluate the process of manufacturing steps for forming the transistor selected in the selection column 42*b* of a transistor structure. Examples of the process evaluation TEG include a "capacitor TEG (C)", a "resistor TEG (R)", a "contact TEG (Cn)", and an "analysis TEG (A)".

Although details are not illustrated in FIG. 3, for example, in the case where a "resistor TEG (R)" is selected in the selection column 42*c* of the process evaluation TEG, a process evaluation TEG can be specifically selected from a resistor TEG, a Kelvin-connected resistor TEG, a sheet resistor TEG, a contact TEG, a coverage and short TEG, an open and short TEG, and the like, and a TEG layout can be generated.

For example, the resistor TEG will be described in more detail. As the resistor TEG, a TEG for controlling a resistance of a semiconductor layer used for a transistor, a TEG for controlling a resistance of a conductive film used for a gate of a transistor, a TEG for controlling a conductive film used for a source or a drain of a transistor, a TEG for controlling a resistance of a conductive film used for a back gate of a transistor, a TEG for controlling a contact resistance to connect the conductive films, and the like are given.

The TEG generation program 32 can automatically generate the TEG layout selected in the selection column 42*c* of the process evaluation TEG. Note that it is preferable that the process evaluation TEG to be generated be selected arbitrarily.

The step information 43 includes a register column 43*a* of a step name and a step list column 43*b*. In the register column 43*a* of a step name, a step name (FileName) can be registered in "New". Alternatively, a step name that is already "registered" can be selected. When a step name that is already registered is selected, a step list of already-registered step names can be displayed on the step list column 43*b*. Note that in the case where a transistor structure is selected in the selection column 42*b* of a transistor structure, a step name relating to the selected transistor structure can be displayed. Note that in the displayed step list, addition, elimination, or the like of a step can be conducted and a new step name can be added to the step list and saved.

In FIG. 3, for example, in the step list column 43*b*, a step list of Type_A, a transistor selected in the selection column 42*b* of a transistor structure is shown. The step list includes items such as Number No., Step type, Apparatus, Component 1, and Component 2. Number No. represents an order of steps, and Step type represents a film-formation step (such as inorganic film formation, semiconductor film formation, or conductive film formation) or processing step (such as an etching step or a CMP (Chemical Mechanical Polishing) step). In Apparatus, manufacturing apparatuses are associated with the respective manufacturing steps. Furthermore, each of Components 1 and 2 can give information which component in a semiconductor element is formed by Step type. For example, Component 1 represents components (such as a channel, a gate film, a gate electrode, and a source or a drain (SD electrode)) of a transistor, and Component 2 represents components (electrode 1, electrode 2, and capacitor film) included in a capacitor. Note that addition or elimination of Step type can be made as necessary.

An example of a step list, No. "2" in the step list is explained. In No. "2", "semiconductor film form." is associated with Step type; "Apparatus M2", Apparatus; "Channel", Component 1; and "—", Component 2. In detailed description, Apparatus M2 is used in the step of semiconductor film formation and a semiconductor film serves as a channel. Note that description of the other manufacturing steps in the step list is omitted.

The TEG generation button 45 has a function of making the TEG generation program 32 automatically generate a layout of a TEG with the type selected by the TEG block setting 42. In addition, when "auto" is selected in the selection column 41*b* of coordinate selection, the TEG generation program 32 can automatically arrange the layout positions of a plurality of TEGs and the automatically-arranged plurality of TEGs can be stored with a designated TEG block name. Alternatively, when "manual" is selected in the selection column 41*b* of coordinate selection, the layout positions of a plurality of TEGs can be freely arranged and the automatically-arranged plurality of TEGs can be stored with a designated TEG block name. Although "Create" is represented in the TEG generation button 45 in FIG. 3, one embodiment of the present invention is not limited thereto.

The TEG generation program 32 preferably generates a plurality of transistor TEGs for evaluating the dependence on a channel length and a channel width of a transistor, in the case of generating the TEG layout.

Figure 4:
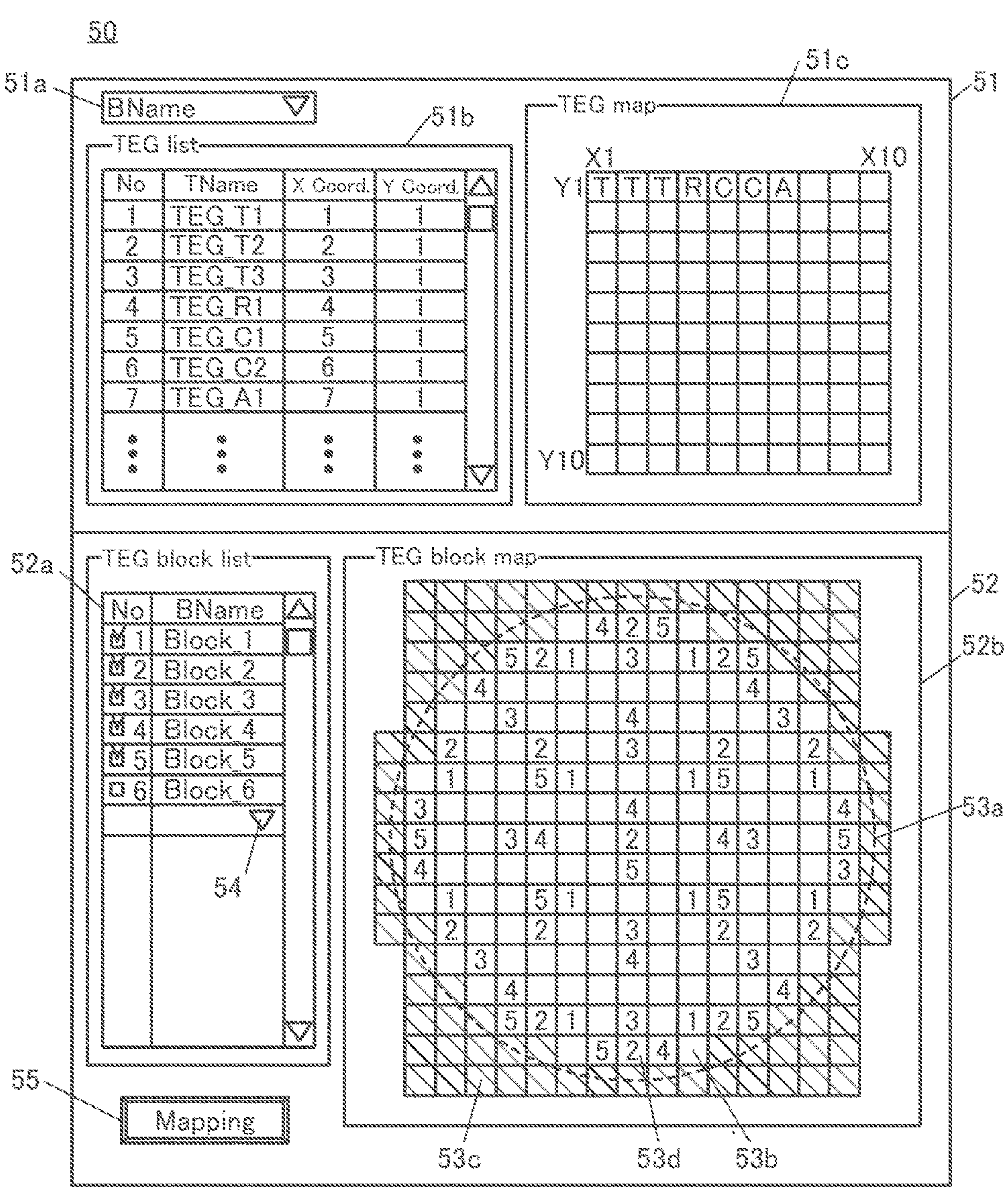
FIG. 4 is a diagram illustrating a display screen of a TEG map.

FIG. 4 illustrates a display screen of a TEG map. A TEG map 50 includes a TEG block display region 51 and a substrate map display region 52.

The TEG block display region 51 includes a selection column 51*a* of a TEG block name, a TEG list 51*b*, and a TEG map 51*c*. In the selection column 51*a* of a TEG block name, a registered TEG block can be selected. The TEG list 51*b* includes TEG number No., TEG name TName, X coordinate, and Y coordinate. FIG. 4 illustrates an example in which the TEG map 51*c* has a region where ten TEGs can be arranged in the X direction and ten TEGs can be arranged in the Y direction. Note that the TEG map 51*c* shows a region of a selected TEG block. Note that the TEG block name, BName, is preferably registered in the database 35.

In FIG. 4, a TEG included in the TEG block selected in the selection column 51*a* of the TEG block name, BName is shown in the TEG list 51*b*. FIG. 4 illustrates an example in which the TEG list 51*b* includes TEGs for a transistor (TEG_T1, TEG_T2, and TEG_T3), a TEG for a resistor (TEG_R1), TEGs for a capacitor (TEG_C1 and TEG_C2), and a TEG for analysis (TEG_A1). The respective TEGs are associated with the positional coordinates of the TEG map.

Next, the TEG map 51*c* is explained. In the TEG map 51*c*, a TEG for a transistor is represented by "T"; a TEG for a resistor, "R"; a TEG for a capacitor, "C"; and a TEG for analysis, "A". If the screen has a sufficient display region, more detailed information is preferably displayed. For example, in the case where TEG_T1 is displayed, "T1" is preferred to "T".

Next, the substrate map display region 52 is described. The substrate map display region 52 includes a TEG block list 52*a*, a TEG block map 52*b*, and a mapping execution button 55.

The TEG block list 52*a* is a list in which TEG blocks to be arranged on a substrate are registered. An addition button 54 is used to register a new TEG block name, BName, in the TEG block list 52*a*. Whether or not the TEG block registered in the TEG block list 52*a* is laid out on a substrate can be selected with a check box.

In the TEG block map 52*b*, a region where a TEG block can be laid out is shown based on the selection column 41*a* of the substrate shape set in the substrate setting 41. FIG. 4 illustrates an example in which a circular substrate is selected. Thus, a region 53*b* in an area inside a circle 53*a* is a region in which a TEG block can be laid out. Note that a region 53*c* represents a no-layout region of a TEG block.

With the mapping execution button 55, a TEG block that is registered in the TEG block list 52*a* and selected can be laid out in a layout region (region 53*b*) of the substrate. Although "Mapping" is represented in the mapping execution button 55 in the example of FIG. 4, one embodiment of the present invention is not limited thereto. The TEG map generation program 33 determines the arrangement of the TEG block using a learning model that has learned an in-plane variation of a manufacturing apparatus. The learning model can arrange a TEG block at a position where an in-plane variation of a manufacturing apparatus is likely to occur.

The TEG block map 52*b* illustrated in FIG. 4 is an example in which five kinds of TEG blocks registered in the TEG block list 52*a* are arranged. In the region 53*d* where the TEG blocks are arranged, the numbers corresponding to the TEG blocks are shown.

For example, when the TEG block name, BName, is a block name, Block_1, "1" is shown in the region 53*d*; when the block name is Block_2, "2" is shown in the region 53*d*; when the block name is Block_3, "3" is shown in the region 53*d*; when the block name is Block_4, "4" is shown in the region 53*d*; and when the block name is Block_5, "5" is shown in the region 53*d*.

Figure 5:
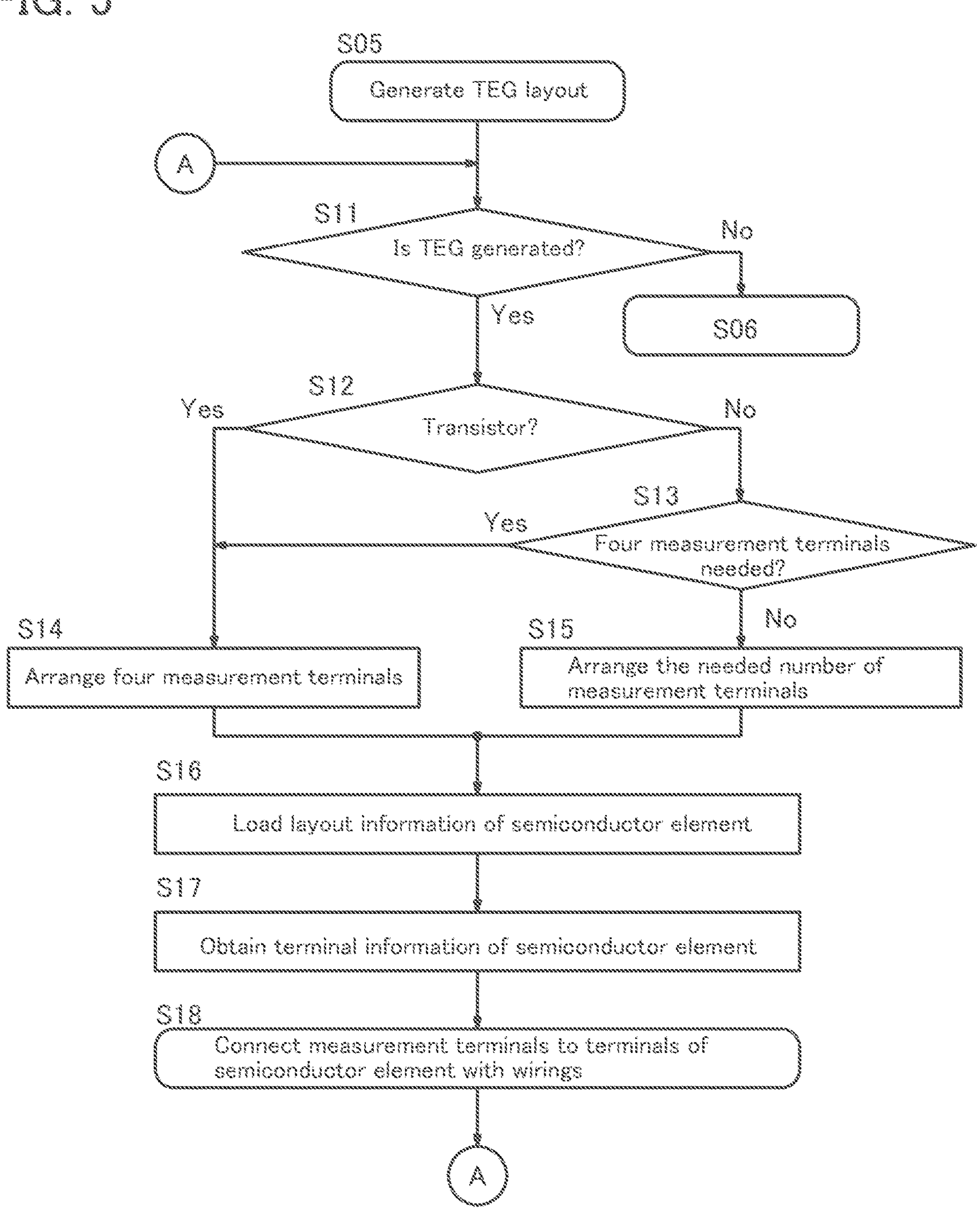
FIG. 5 is a flowchart illustrating a method for generating a TEG layout.

FIG. 5 is a flowchart illustrating a TEG layout generation method. FIG. 5 is a flowchart describing details of Step S05 in the flowchart of FIG. 2.

Step S11 is a step of referring to the TEG list generated by the TEG block setting 42. The step goes to Step S12 when there is a TEG whose layout is not generated or goes to Step S06 in FIG. 2 when a TEG layout of the TEG list has been generated.

Step S12 is a step of judging whether or not the semiconductor element included in a TEG to be laid out is a transistor. When the semiconductor element is a transistor, go to Step S14, or when the semiconductor element is a component other than a transistor, go to Step S13.

Step S13 is a step of determining whether the semiconductor element needs to have four measurement terminals. For example, four measurement terminals are needed for measuring a Kelvin-connected resistor TEG. If four measurement terminals are needed, go to Step S14, or otherwise, go to Step S15.

Step S14 is a step of arranging the four measurement terminals in a TEG. Next, go to Step S16.

Step S15 is a step of arranging the needed number of measurement terminals for a TEG. Next, go to Step S16.

Step S16 is a step of loading layout information of a semiconductor element included in the TEG from the TEG information 35*a*. Next, go to Step S17.

Step S17 is a step of obtaining terminal information from the loaded layout information of the semiconductor element. For example, in the case where the semiconductor element is a transistor, layout information of a gate electrode, a source electrode, a drain electrode, a back gate electrode, or the like can be obtained. As a different example, layout information of electrode 1, electrode 2, or the like can be obtained in the case where the semiconductor element is a resistor or a capacitor. Next, go to Step S18.

Step S18 is a step of connecting the measurement terminals to the respective terminals of the semiconductor element with wirings. The step is described in detail in FIG. 6. The TEG layout is completed by connecting the measurement terminals to the respective terminal included in the semiconductor element with a wiring. Next, go to Step S11. Until all the TEGs each have a generated layout, Step S12 to Step S18 are repeatedly conducted.

Figure 6:
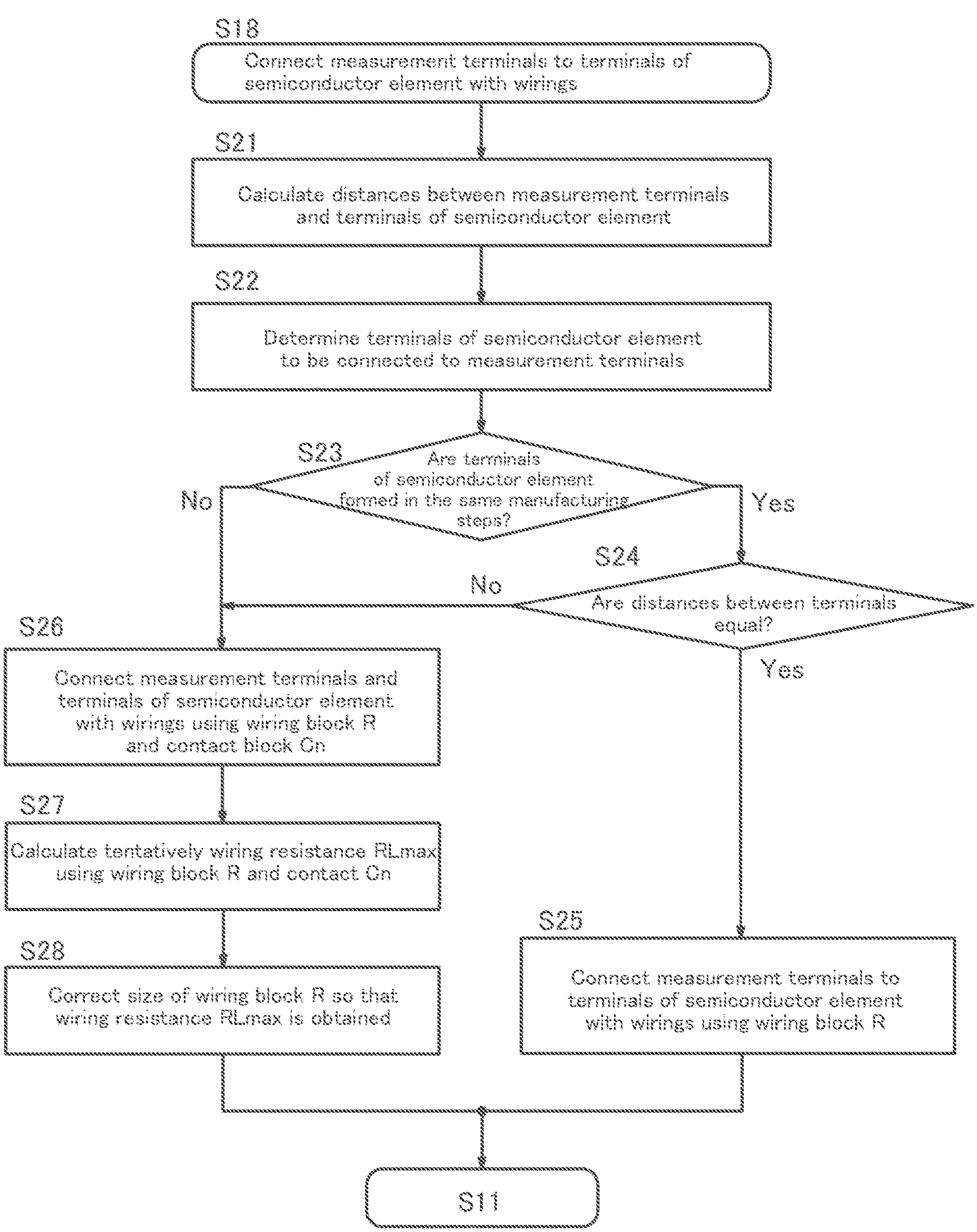
FIG. 6 is a flowchart illustrating a method for generating a TEG layout.

Next, FIG. 6 is a flowchart describing a method for generating the TEG layout. FIG. 6 is a flowchart illustrating details of Step S18 in the flowchart of FIG. 5.

Step S21 is a step of calculating distances between coordinates of the four measurement terminals (PD1, PD2, PD3, and PD4) and coordinates of the terminals (Pa, Pb, and Pc) of the semiconductor element. Next, go to Step S22.

Step S22 is a step of determining terminals of the semiconductor element to which the measurement terminals are connected. For example, a distance d1 between the measurement terminal PD1 and the terminal Pa of the semiconductor element, a distance d2 between the measurement terminal PD2 and the terminal Pb of the semiconductor element, and a distance d3 between the measurement terminal PD3 and the terminal Pc of the semiconductor element are calculated. Note that the measurement terminals are to be connected with the respective terminals of the semiconductor element that are closer to the measurement terminals. Next, go to Step S23.

Step S23 is a step of determining whether the terminal Pa, the terminal Pb, and the terminal Pc of the semiconductor element are generated in the same manufacturing steps. For example, in the case where the terminal Pa, the terminal Pb, and the terminal Pc of the semiconductor element are formed in the same manufacturing steps, go to Step S24. In the case where at least any one of the terminal Pa, the terminal Pb, and the terminal Pc of the semiconductor element is formed in a different manufacturing step, go to Step S26.

Step S24 is a step of judging whether the distance d1, the distance d2, and the distance d3 between the terminals are equal (or substantially equal). When the distances between the terminals are equal (or substantially equal), go to Step S25. When the distances between the terminals are different, go to Step S26.

Step S25 is a step of connecting the measurement terminals to the terminals of the semiconductor element with use of a wiring block R. For example, the TEG generation program 32 connects the measurement terminal PD1 to the terminal Pa of the semiconductor element with use of the wiring block R, the measurement terminal PD2 to the terminal Pb of the semiconductor element with use of the wiring block R, and the measurement terminal PD3 to the terminal Pc of the semiconductor element with use of the wiring block R.

Note that the layout of the wiring can be formed using a plurality of wiring blocks R. As an example, a wiring having a wiring block R(1) and a wiring block R(2) can be used to connect the measurement terminal PD1 and the terminal Pa of the semiconductor element. In addition, the wiring having the wiring block R(1) and the wiring block R(2) can be used to connect the measurement terminal PD2 and the terminal Pb of the semiconductor element. Moreover, the wiring having the wiring block R(1) and the wiring block R(2) can be used to connect the measurement terminal PD3 and the terminal Pc of the semiconductor element.

Note that the shape and the resistance value with respect to a distance of the wiring block R(1) may be the same (or substantially the same) as or different from those of the wiring block R(2). Note that the wiring resistances of the wirings having the wiring block R(1) and the wiring block R(2) are preferably equal (or substantially equal). In the case where the layout in which the measurement terminals are connected to the terminals of the semiconductor element using wirings having wiring blocks R is completed, go to Step S11.

Step S26 is a step of connecting the measurement terminals and the terminals of the semiconductor element using the wiring block R and a contact block Cn. For example, the TEG generation program 32 connects the measurement terminal PD1 to the terminal Pa of the semiconductor element using a wiring 1, the measurement terminal PD2 to the terminal Pb of the semiconductor element using a wiring 2, and the measurement terminal PD3 to the terminal Pc of the semiconductor element using a wiring 3.

Step S27 is described next. Step S27 is a step of tentatively calculating the wiring resistances of the wiring 1 in the distance d1, the wiring 2 in the distance d2, and the wiring 3 in the distance d3. Note that the wiring 1, the wiring 2, and the wiring 3 may each include the contact block Cn. The wiring resistance of each wiring is tentatively calculated, the wiring with the maximum wiring resistance is detected, and a resistance component of the wiring is represented by a wiring resistance RLmax. Next, go to Step S28. Note that the contact block Cn has a contact resistance.

Step S28 is a step of correcting the wiring blocks R of other wirings so that the wiring resistances of the other wirings can be equal to the wiring resistance RLmax. Correction of the wiring blocks R can be adjusted with the number of the wiring block R(1) to the wiring block R(n). Alternatively, correction can be made in such a manner that the sizes of the wiring blocks R are made different and the wiring block Ra is made to have the wiring resistance that is equal to the wiring resistance RLmax. The contact resistance can be corrected by changing the number of contacts included in the contact block Cn.

For example, in the case where the wiring resistance RL(1) of the wiring 1 is the wiring resistance RLmax, the wiring resistance RL(2) and the wiring resistance RL(3) are preferably equal (or substantially equal) to the wiring resistance RL(1).

Description is made on the case where the wiring 1 includes the wiring block R(1), a contact block Cn(1), and the wiring block R(2), and the wiring resistance of the wiring 1 is the wiring resistance RL(1).

In the case where the wiring 2 is formed with the wiring block R(1) and a wiring block R(3), the wiring block R(3) is selected such that the wiring resistance RL(2) of the wiring 2 is equal (or substantially equal) to the wiring resistance RL(1). The size of the wiring block R(3) is preferably selected so as to be the same (or substantially the same) as those of the contact block Cn(1) and the wiring block R(2).

In the case where the wiring 3 includes the wiring block R(1), the contact block Cn(2), and the wiring block Ra(1), the contact resistance of the contact block Cn(2) is corrected so that the wiring resistance RL(3) of the wiring 3 can be equal (or substantially equal) to the wiring resistance RL(1) and the wiring block Ra(1) obtained by correcting the size of the wiring block R(1) is selected. After the layout in which the measurement terminals are connected to the respective terminals of the semiconductor element using the wiring 1 to the wiring 3, go to Step S11.

Figure 7A:
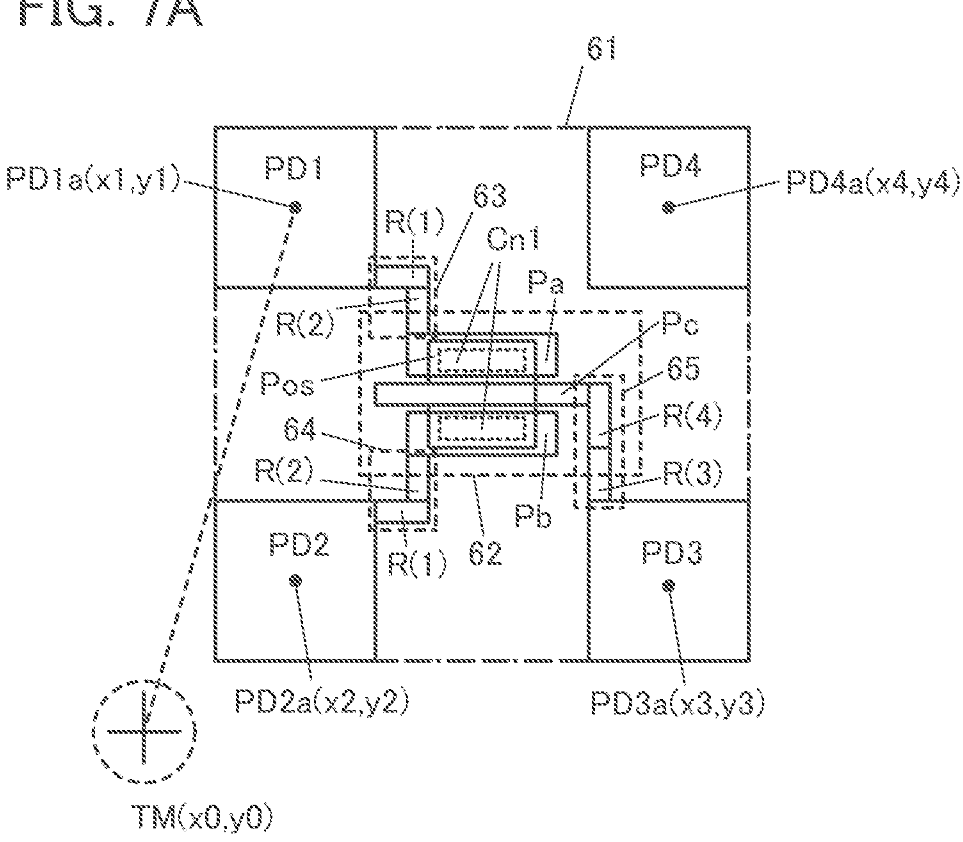
FIG. 7A and FIG. 7B are diagrams each illustrating a TEG layout.
Figure 7B:
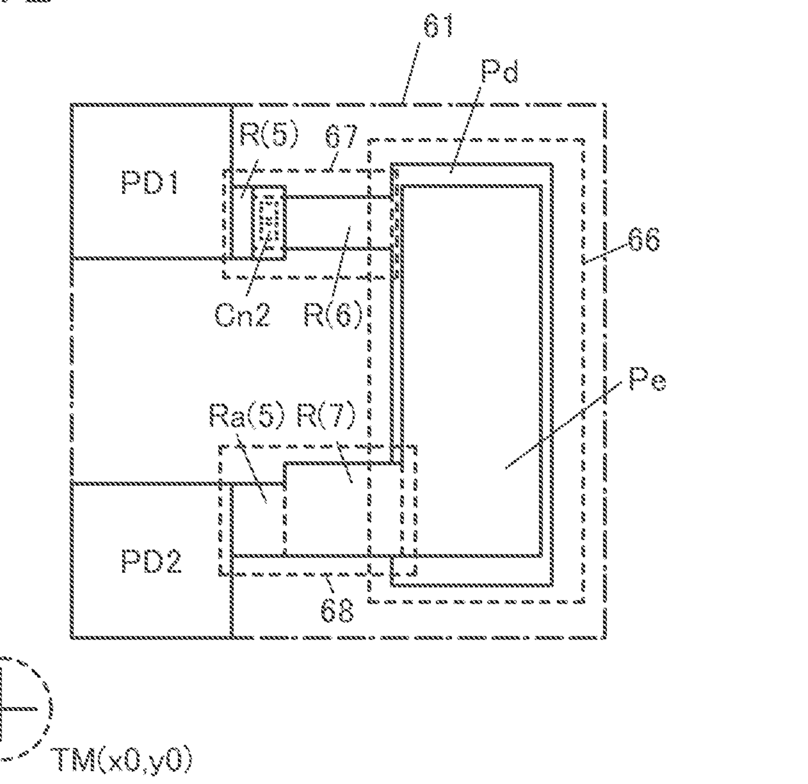

FIG. 7A and FIG. 7B are diagrams each illustrating a TEG layout. The TEG layout is generated in accordance with the flowcharts described with FIG. 5 and FIG. 6.

FIG. 7A illustrates an example of a TEG layout having a transistor as a semiconductor element. FIG. 7A illustrates an example in which the TEG has a TEG region 61 and a marker TM. The TEG region 61 includes the measurement terminal PD1 to the measurement terminal PD4, a transistor 62, a wiring 63, a wiring 64, and a wiring 65. The wiring 63 includes the wiring block R(1) and the wiring block R(2). The wiring 64 includes the wiring block R(1) and the wiring block R(2). The wiring 65 includes the wiring block R(3) and the wiring block R(4). The transistor 62 has the terminal Pa, the terminal Pb, and the terminal Pc. Note that the transistor includes a semiconductor film Pos, the semiconductor film Pos is connected to the terminal Pa through a contact block Cn1, and the semiconductor film Pos is connected to the terminal Pb via a contact block Cn2.

The reference points of the measurement terminals are each a center coordinate of the measurement terminal. The measurement terminal PD1 has a reference point PD1*a* (x1, y1), for example. The measurement terminal PD2 has a reference point PD2*a* (x2, y2). The measurement terminal PD3 has a reference point PD3*a* (x3, y3). The measurement terminal PD4 has a reference point PD4*a* (x4, y4). Note that the marker TM corresponds to a reference point defining the position of the TEG region 61. Therefore, the positions of the measurement terminal PD1 to the measurement terminal PD4 are determined with the center of the marker TM (x0, y0) as the origin.

Next, the connections between the measurement terminals and the terminals of the semiconductor element are described. In an example, the measurement terminal PD1 is connected to the terminal Pa of the transistor through the wiring 63. The measurement terminal PD2 is connected to the terminal Pb of the transistor through the wiring 64. The measurement terminal PD3 is connected to the terminal Pc of the transistor through the wiring 65. The wiring resistance of the wiring 63 is preferably equal (or substantially equal) to the wiring resistance of the wiring 64. In FIG. 7A, the wiring 63 and the wiring 64 each include the wiring block R(1) and the wiring block R(2). Thus, the wiring 63 and the wiring 64 are laid out so as to have equal (or substantially equal) wiring resistance.

The wiring resistance of the wiring 63 is preferably equal (or substantially equal) to the wiring resistance of the wiring 65. The wiring 63 includes the wiring block R(1) and the wiring block R(2), while the wiring 65 includes the wiring block R(3) and the wiring block R(4). Therefore, the shape and the wiring resistance of the wiring block R(3) and the wiring block R(4) are preferably determined so that the combined resistance of the wiring block R(3) and the wiring block R(4) can be equal to the combined resistance of the wiring block R(1) and the wiring block R(2). The wiring 65 can further include a contact block.

FIG. 7B is a TEG layout including a capacitor as the semiconductor element. For example, the TEG has the TEG region 61 and the marker TM. The TEG region 61 includes the measurement terminal PD1, the measurement terminal PD2, a capacitor 66, a wiring 67, and a wiring 68. The wiring 67 includes a wiring block R(5), the contact block Cn2, and a wiring block R(6). The wiring 67 includes a wiring block Ra(5) and a wiring block R(7). The capacitor 66 includes an electrode Pd and an electrode Pe.

The measurement terminal PD1 is connected to the electrode Pd of the capacitor through the wiring 67. The measurement terminal PD2 is connected to the electrode Pe of the capacitor through the wiring 68. Furthermore, the wiring resistance of the wiring 67 is preferably equal (or substantially equal) to the wiring resistance of the wiring 68. The wiring 67 includes the contact block Cn2 and the wiring resistance of the wiring 67 is sometimes higher than that of the wiring 68. Therefore, the wiring block of the wiring 68 is preferably selected so that the wiring resistance of the wiring 68 is equal (or substantially equal) to the wiring resistance of the wiring 67. The resistance of the wiring block Ra(5) can be heightened by increasing the distance as compared with the wiring block R(5). The wiring block R(7) can have a resistance different from that of the wiring block R(6).

Figure 8A:
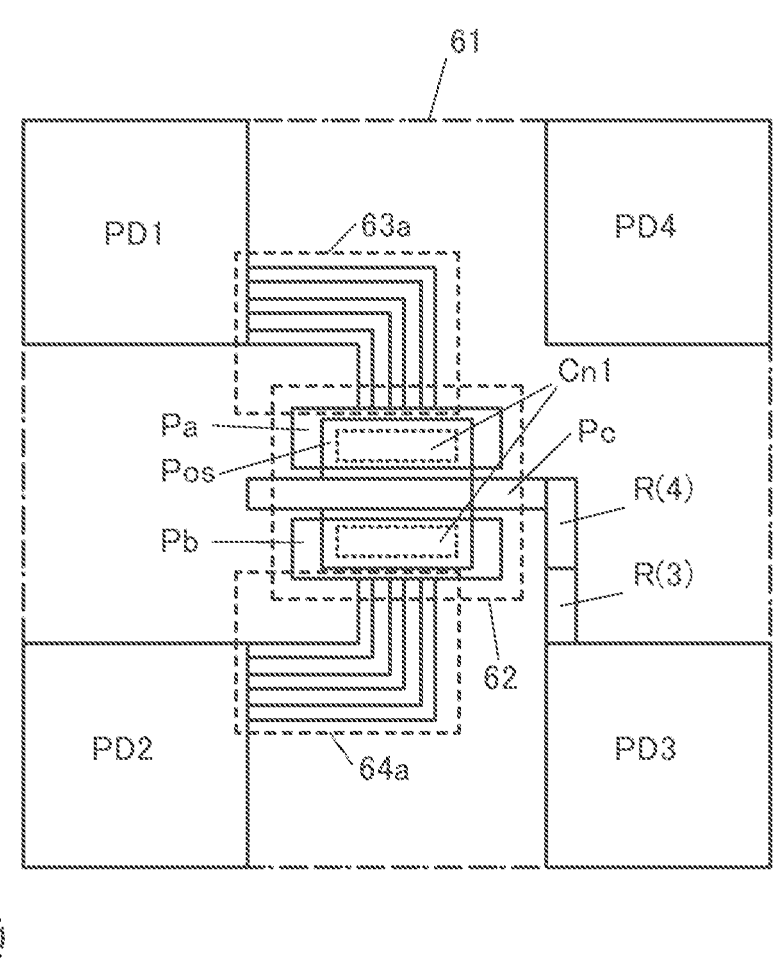
FIG. 8A and FIG. 8B are diagrams each illustrating a TEG layout.
Figure 8B:
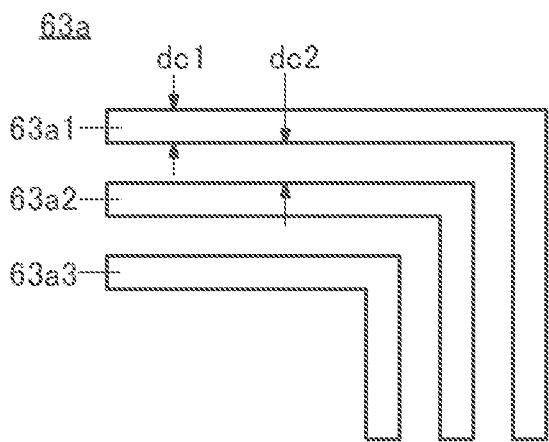

FIG. 8A and FIG. 8B are diagrams each illustrating a TEG layout. FIG. 8A is different from FIG. 7A in that a wiring 63*a* and a wiring 64*a* are provided. FIG. 8B is a diagram illustrating the wiring 63*a* in detail. Note that in the structures of the invention described below, the same portions or portions having similar functions are denoted by the same reference numerals in different drawings, and description thereof is not repeated.

As illustrated in FIG. 8B, the wiring 63*a* is a wiring block in which the wiring width that can be processed is limited to a wiring width dc1, and the interval between wirings is limited to a wiring interval dc2. The wiring block can be automatically selected in the case where a CMP step is selected as a processing step of a conductive film. In the case where the CMP step is selected as the processing step, the wiring width dc1 and the wiring interval dc2 are sometimes limited by the processing accuracy of the manufacturing apparatus. As an example, the combined resistance of a wiring 63*a*1, a wiring 63*a*2, and a wiring 63*a*3 is the wiring resistance of the wiring 63*a*. Although FIG. 8B illustrates the example in which the wiring 63*a* includes three wirings, the number of wirings included in the wiring 63*a* can be selected as appropriate in accordance with a desired wiring resistance. The description of the wiring 63*a* can be referred to for the wiring 64*a*; thus, the detailed description thereof is omitted.

Figure 9:
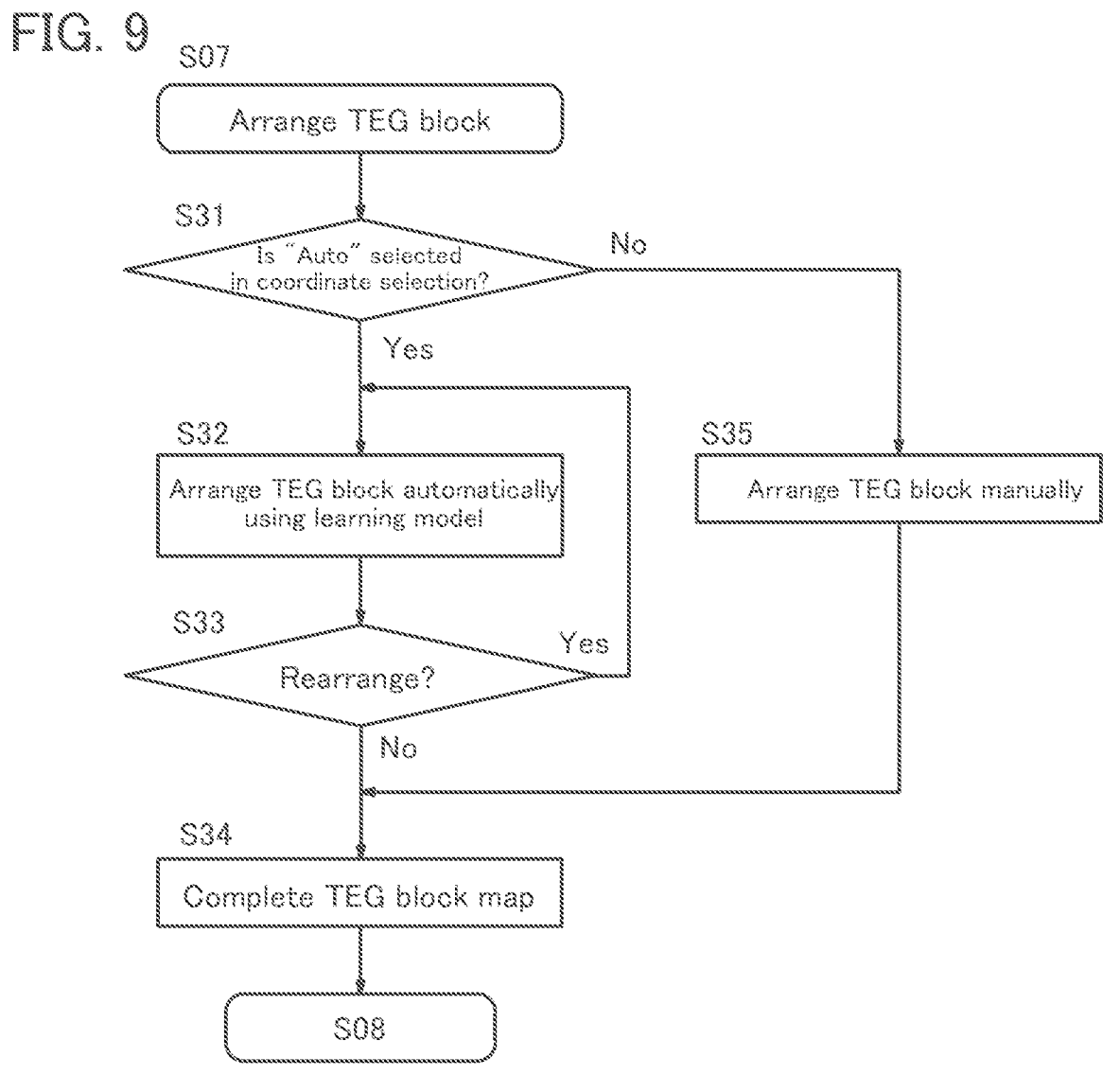

FIG. 9 is a flowchart describing an arrangement method of a TEG block. The flowchart corresponds to Step S07 in FIG. 2.

The TEG map generation program 33 can arrange a TEG block on a substrate using the learning model 34. The learning model 34 preferably learns with use of the measurement data of an in-plane distribution (electric, film thickness, film quality, or the like) of an existing manufacturing apparatus. For example, the TEG block which is selected from the TEG block list illustrated in FIG. 4 is given to the learning model as inference data. The learning model 34 can arrange the TEG block at a position appropriate for a grasp of the in-plane distribution of a semiconductor element. Thus, the TEG map generation program 33 can file-output information of arrangement of the TEG block as data of the TEG map and the data can be displayed on a display device.

Next, the flowchart in FIG. 9 is described in detail. Step S31 is a step of determining whether or not “Auto” is selected in the selection column 41*b* of coordinate selection. When “Auto” is selected, go to Step S32. Note that when “Manual” is selected in the selection column 41*b* of coordinate selection, go to Step S35. Note that in Step S35, the arrangement and number of the TEG blocks are assigned manually to form the TEG block map 52*b*.

Step S32 is a step of automatically arranging the TEG block on a substrate using the learning model. The TEG block list is given to the learning model as inference data. The learning model can arrange the TEG block at such a position that an in-plane distribution of a manufacturing apparatus can be extracted appropriately. Next, go to Step S33.

Step S33 is a step of confirming whether or not the arranged TEG blocks are needed to be rearranged. In the detailed description, the TEG blocks arranged by the learning model are displayed on a display device as the TEG block map 52*b* by the TEG map generation program 33. In the example of the TEG block map 52*b* in FIG. 4, the TEG blocks are shown in the TEG block map 52*b*, for example. When rearrangement is needed, go to Step S32, or when rearrangement is not needed, go to Step S34. In the case of rearrangement, the TEG block map 52*b* can be rearranged by the mapping execution button 55. Furthermore, in the case of rearrangement, the number of the TEG blocks can be assigned preferably.

Step S34 is a step of completing the TEG block map 52*b*. The case where the TEG block map 52*b* is completed means a state where the positional information of the TEG blocks arranged in the TEG block map 52*b*, the TEG block list, and the like are stored in a file. In addition, it means a state where the positional information of the TEG blocks arranged in the TEG block map 52*b*, the TEG block list, and the like can be reused.

Figure 10A:
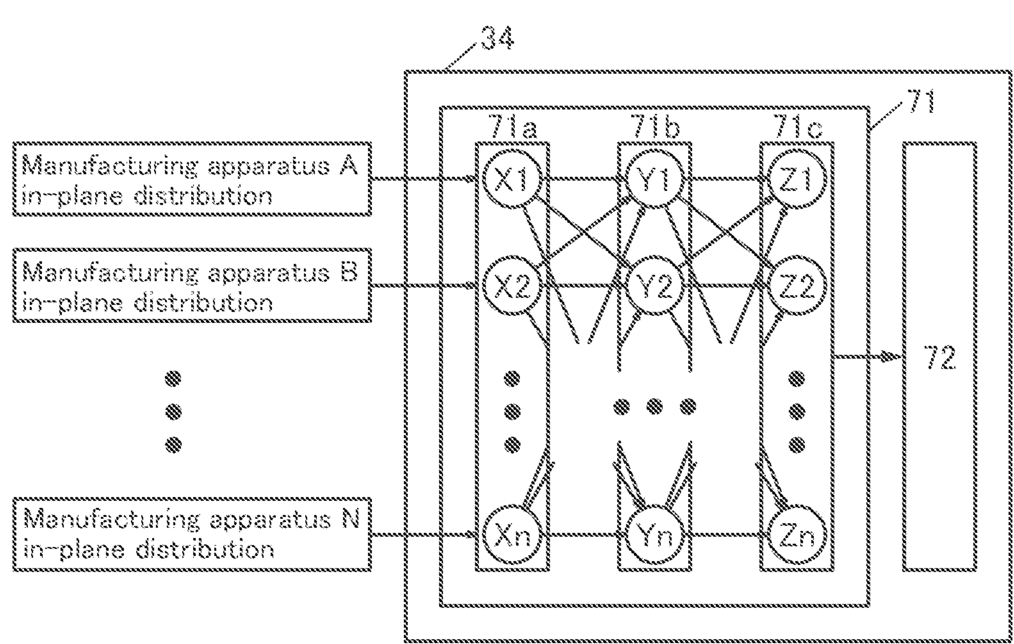
FIG. 10A is a diagram illustrating a learning model that learns an in-plane distribution of an apparatus.

FIG. 10A is a diagram illustrating the learning model 34 that learns an in-plane distribution of an apparatus.

The learning model 34 includes a neural network 71 and a neural network 72, for example. The neural network 71 includes an input layer 71*a*, a hidden layer 71*b*, and a hidden layer 71*c*. Note that a plurality of hidden layers 71*b* can be provided. The neural network 72 functions as a fully-connected layer. The input layer 71*a* has a neuron X1 to a neuron Xn, the hidden layer 71*b* has a neuron Y1 to a neuron Yn, and the hidden layer 71*c* has a neuron Z1 to a neuron Zn. Note that n is a positive integer greater than 2.

The neural network 71 is supplied with measurement data of a manufacturing apparatus as learning data. The measurement data includes the in-plane distribution of each manufacturing apparatus. Note that each measurement data supplied as learning data is preferably data measured in accordance with all the coordinates of the TEG block map 52*b*. The neurons in the neural network 71 learn the measurement data as learning data.

Thus, the neural network 71 outputs a feature vector from the kind of TEG formed in the manufacturing process and the measurement data of the TEG. Thus, the learning model 34 can be rephrased as a multimodal learning model. Therefore, the feature vector output from the neural network 71 is not limited to one. A plurality of feature vectors can be output. Hereinafter, the case where the neural network 71 outputs a plurality of feature vectors is described.

The plurality of feature vectors generated by the neural network 71 are supplied to the neural network 72. Thus, the neural network 72 preferably includes a fully-connected layer corresponding to multimodal input. The neural network 72 can collectively handle a plurality of feature vectors output from the neural network 71 by having a fully-connected layer.

Note that a sigmoid function, a step function, a ramp function (ReLU: Rectifield Linear Unit), or the like can be used as an activation function for each output of the fully-connected layer. The non-linear activation function can be effectively used to make feature vectors of a plurality of different kinds of learning data. Thus, the neural network 72 can learn measurement data including an in-plane distribution of the TEG formed in a manufacturing process, which is given as the learning data.

Figure 10B:
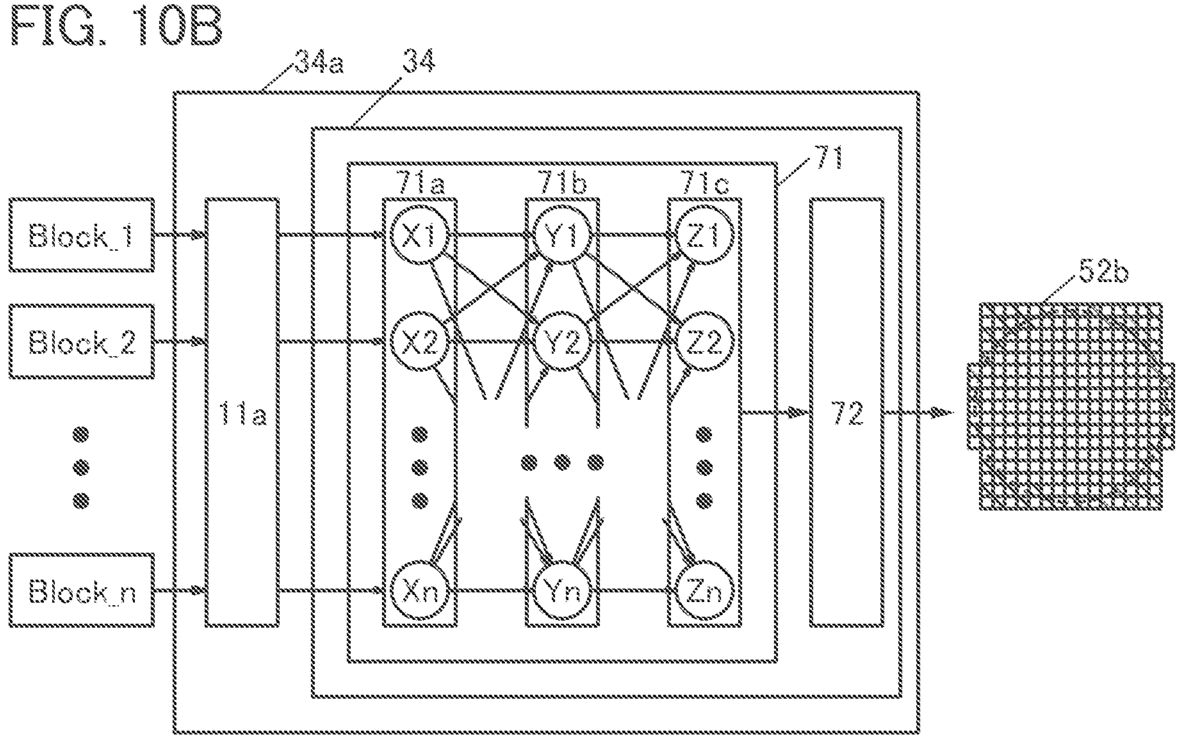
FIG. 10B is a diagram illustrating a learning model that can arrange a TEG block.

FIG. 10B illustrates a learning model 34*a* which can arrange a TEG block. The learning model 34*a* illustrated in FIG. 10B is different from the learning model illustrated in FIG. 10A in that an input layer 11*a* is further provided. The neural network 71 and the neural network 72 are learning models which have learned measurement data of the TEG formed in manufacturing steps.

The input layer 11*a* corresponds to an input interface for giving the TEG block arranged in the TEG block map 52*b* as inference data to the neural network 71 which has learned. The input layer 11*a* can be used to give inference data in number different from the number of inputs of the input layer 71*a* of the neural network 71 which has learned. The inference data represents a plurality of TEG blocks (e.g., Block_1 and Block_2 to Block_n in FIG. 10B) included in the TEG block list. Note that the TEG block includes a plurality of TEGs. Note that all of the TEGs included in the respective TEG blocks may be different types or some of the TEGs may be different types. Each of the TEGs is associated with the corresponding manufacturing apparatus for forming a semiconductor element by the step information 43.

Accordingly, the learned learning model 34*a* can arrange TEG blocks in the TEG block map 52*b* when a plurality of TEG blocks included in the TEG block list are given. The learning model 34*a* can arrange each TEG block at an appropriate position that can reproduce an in-plane distribution of the TEG formed in manufacturing steps. Furthermore, the learning model 34*a* can arrange TEG blocks in number that enables the influence of the in-plane distribution of the TEG formed in manufacturing steps upon a semiconductor element to be reproduced.

Figure 11:
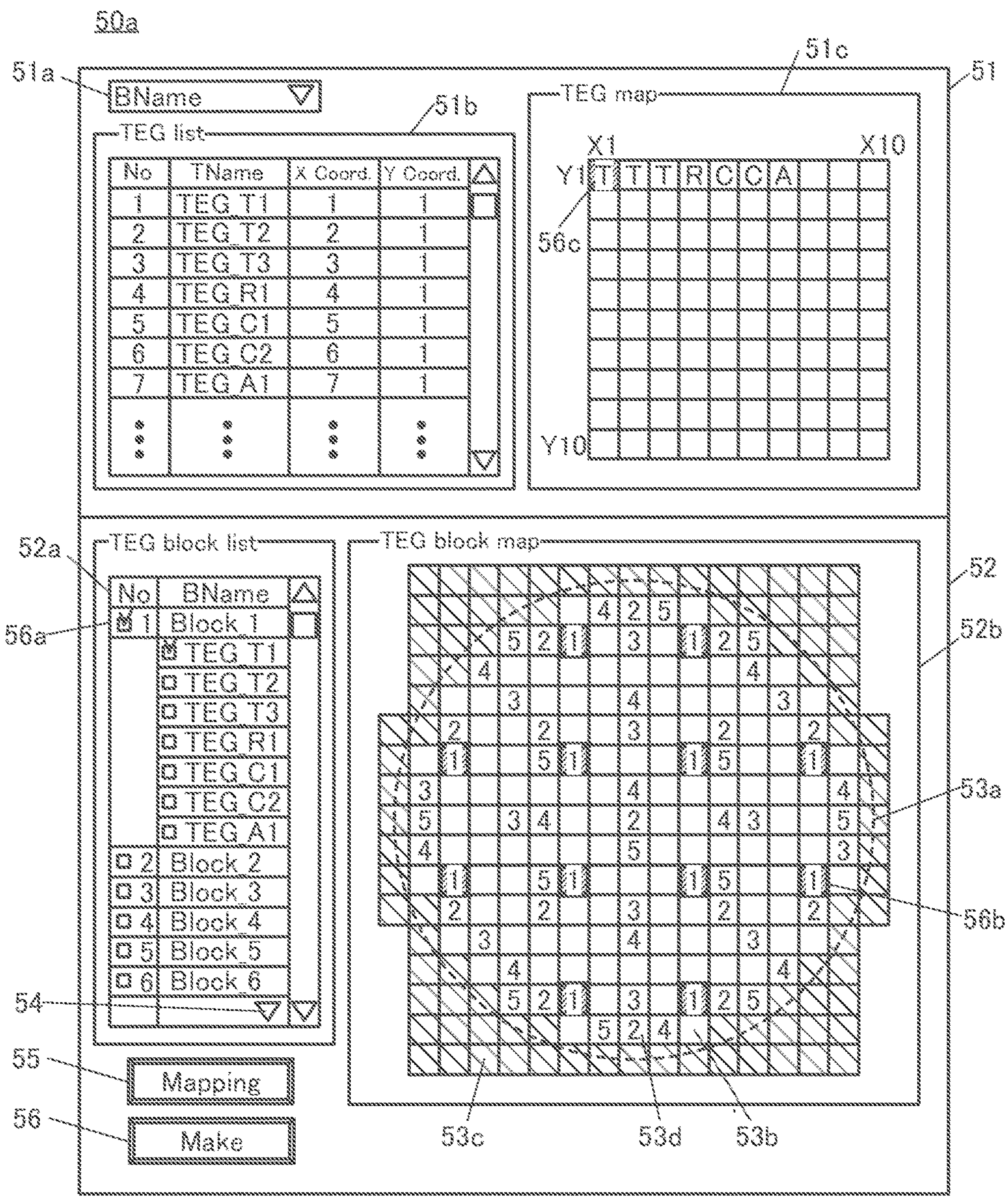
FIG. 11 is a diagram illustrating a method for generating a measurement recipe from a TEG block map.

FIG. 11 illustrates a method for generating a measurement recipe from the TEG block map 52*b*. FIG. 11 is different from FIG. 4 in that a make button 56 is provided. Note that in structures of the invention described below, the same portions or portions having similar functions are denoted by the same reference numerals in different drawings, and a description thereof is not repeated. Furthermore, the same hatch pattern is used for the portions having similar functions, and the portions are not especially denoted by reference numerals in some cases.

The TEG map generation program 33 can generate a measurement recipe from the generated TEG block map 52*b*. As an example, when a selection box 56*a* which is displayed on the TEG block list 52*a* is selected, the number No. "1" is selected. By selecting the number No. "1", the TEG list included in the TEG block is expanded and at the same time, the frame of a region 56*b* where the block name, Block_1, is arranged is highlighted. Note that "1" is displayed in the region 56*b* where the block name, Block_1, is arranged. In addition, when a TEG name, TName "TEG_T1" is selected from the expanded TEG list, the background of the region 56*b* is highlighted (hatched in FIG. 11). Note that in the TEG map 51*c*, a background of a region where the selected TEG name, TName "TEG_T1" is arranged is preferably highlighted.

The measurement recipe is generated, when the measurement target is selected as described above and the make button 56 is pushed. The measurement recipe is generated, with the target TEG name, TName, associated with the coordinate information. Note that the measurement recipe can be stored in a file. Alternatively, the measurement recipe can be transmitted to a measurement device. Although "Make" is represented in the make button 56 in the example of FIG. 11, one embodiment of the present invention is not limited thereto.

Figure 12:
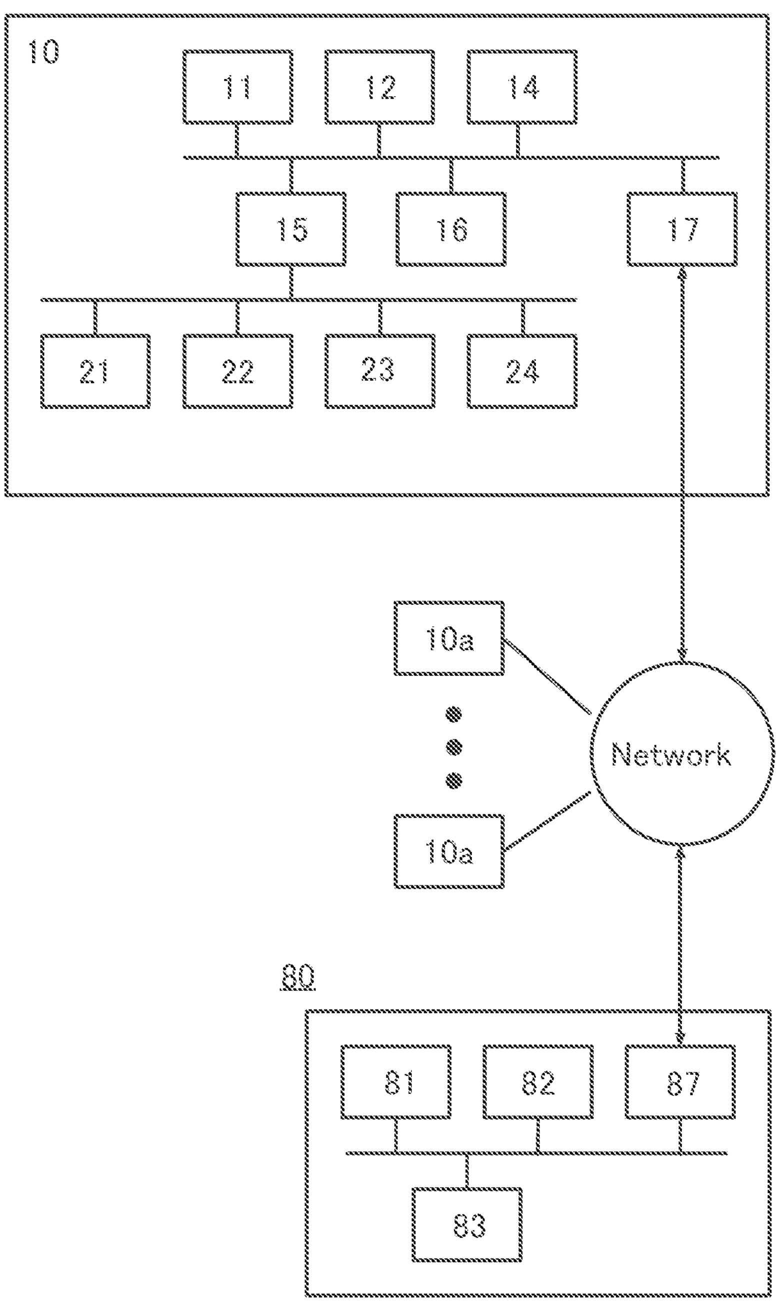
FIG. 12 is a diagram illustrating a TEG control system.

FIG. 12 is a diagram illustrating a TEG control system different from that in FIG. 1. Note that in structures of the invention described below, the same portions as or portions having similar functions to those in FIG. 1 are denoted by the same reference numerals in different drawings, and a description thereof is not repeated. Furthermore, the same hatch pattern is used for the portions having similar functions, and the portions are not especially denoted by reference numerals in some cases.

The computer 10 includes a communication circuit 17. Note that the input/output device 15 is connected to a display device 21, a touch sensor 22, a keyboard 23, a mouse controller 24, and the like. A data server 80 includes a processor 81, a GPU 82, a memory device 83, and a communication circuit 87. The communication circuit 17 can be connected to a plurality of other remote computers 10*a* and the data server 80 via a network (Network). Note that the plurality of other remote computers 10*a* or the data server 80 may be established in Japan or a foreign country.

Here, examples of the network include a local area network (LAN) and the Internet. In addition, either one or both of wired and wireless communications can be used for the network. Furthermore, in the case where a wireless communication is used for the network, besides near field communication means such as Wi-Fi (registered trademark) and Bluetooth (registered trademark), a variety of communication means such as the third generation mobile communication system (3G)-compatible communication means, LTE (sometimes also referred to as 3.9G)-compatible communication means, the fourth generation mobile communication system (4G)-compatible communication means, and the fifth generation mobile communication system (5G)-compatible communication means can be used.

Note that the TEG control system can use the TEG information 35*a*, the coordinate information 35*b*, the property information 35*c*, and the step information 35*d* stored in the other remote computers 10*a* or the data server 80 via a network.

Note that the TEG control system can also be used in the remote computer 10*a* via a network. Alternatively, the TEG control system stored in a memory device in the data server 80 or the remote computer 10*a* can be used and operated in the computer 10. The remote commuter 10*a* may be a portable information terminal or a portable terminal such as a tablet computer or a laptop computer. In the case of a portable information terminal, a portable terminal, or the like, communication can be performed using wireless communication.

According to one embodiment of the present invention, a control system of controlling a TEG layout using a computer can be provided. According to another embodiment of the present invention, a layout method of automatically generating a TEG layout in which wiring resistances between terminals of a semiconductor element and measurement terminals are equal to each other can be provided. According to another embodiment of the present invention, a layout method for automatically arranging a TEG for evaluating a variation in electrical characteristics of a semiconductor element on a substrate can be provided. According to another embodiment of the present invention, a method for generating a TEG block, by which a TEG block for evaluating an in-plane variation of each manufacturing apparatus is automatically generated on a substrate, can be provided. According to another embodiment of the present invention, a learning model of learning information of an in-plane variation in a manufacturing apparatus for manufacturing a semiconductor element can be provided. According to another embodiment of the present invention, a control system in which a learning model arranges a layout of a TEG block on a substrate depending on the kinds of circuits included in the TEG block can be provided.

Parts of this embodiment can be combined as appropriate for implementation.

REFERENCE NUMERALS

Cn2: contact block, dc1: wiring width, dc2: wiring interval, PD1: measurement terminal, PD1*a*: reference point, PD2: measurement terminal, PD2*a*: reference point, PD3: measurement terminal, PD3*a*: reference point, PD4: measurement terminal, PD4*a*: reference point, X1: neuron, Y1: neuron, Z1: neuron, 10: computer, 10*a*: remote computer, 11: processor, 11*a*: input layer, 12: memory device, 14: GPU, 15: input/output device, 16: memory device, 17: communication circuit, 21: display device, 22: touch sensor, 23: keyboard, 31: EDA program, 32: TEG generation program, 33: TEG map generation program, 34: learning model, 34*a*: learning model, 35: database, 35*a*: TEG information, 35*b*: coordinate information, 35*c*: property information, 35*d*: step information, 40: TEG setting screen, 41: substrate setting, 41*a*: selection column of substrate shape, 41*b*: selection column of coordinate selection, 41*c*: selection column of substrate size, 42: TEG block setting, 42*a*: register column of TEG block name, 42*b*: selection column of transistor structure, 42*c*: selection column of process evaluation TEG, 43: step information, 43*a*: register column of step name, 43*b*: step list column, 45: TEG generation button, 50: TEG map, 51: TEG block display region, 51*a*: selection column of TEG block name, 51*b*: TEG list, 51*c*: TEG map, 52: substrate map display region, 52*a*: TEG block list, 52*b*: TEG block map, 53*a*: area inside in a circle, 53*b*: region, 53*c*: region, 53*d*: region, 54: addition button, 55: mapping execution button, 56: generation button, 56*a*: selection box, 56*b*: region, 61: TEG region, 62: transistor, 63: wiring, 63*a*: wiring, 63*a*1: wiring, 63*a*2: wiring, 63*a*3: wiring, 64: wiring, 64*a*: wiring, 65: wiring, 66: capacitor, 67: wiring, 68: wiring, 71: neural network, 71*a*: input layer, 71*b*: hidden layer, 71*c*: hidden layer, 72: neural network, 80: data server, 81: processor, 82: GPU, 83: memory device, 87: communication circuit

The invention claimed is:

1. A control system of automatically arranging a circuit layout on a substrate, wherein the control system comprises a learning model, wherein the learning model comprises a step of learning measurement data comprising an in-plane distribution of a manufacturing apparatus, wherein the learning model comprises a step of automatically arranging the circuit layout on the substrate by giving the circuit layout to the learning model, and wherein the learning model comprises a step of learning an appropriate position for a plurality of TEG blocks and an appropriate number of the TEG blocks to perform evaluation of variation in the substrate.

2. A control system of automatically arranging a circuit layout on a substrate, wherein the control system comprises:

a processor;

a memory device comprising a TEG generation program, a TEG map generation program, a learning model, and a database; and a display device configured to display data generated by the TEG map generation program, wherein the processor is configured to perform processing using at least one of the TEG generation program and the TEG map generation program, wherein the database comprises TEG information, coordinate information, property information, and step information, wherein the learning model comprises a step of learning measurement data comprising an in-plane distribution of a manufacturing apparatus, wherein the learning model comprises a step of automatically arranging the circuit layout on the substrate by giving the circuit layout to the learning model, and wherein the learning model comprises a step of learning an appropriate position for a plurality of TEG blocks and an appropriate number of the TEG blocks to perform evaluation of variation in the substrate.

3. The control system of automatically arranging a circuit layout on a substrate according to claim 2, wherein the TEG information is information on a feasible basic layout of a transistor and basic layout information of a process control element.

4. The control system of automatically arranging a circuit layout on a substrate according to claim 3, wherein the TEG information comprises a circuit TEG, and wherein measurement terminal information and information regarding a TEG size are tied with and stored in each piece of TEG information.

5. The control system of automatically arranging a circuit layout on a substrate according to claim 2, wherein the control system is configured to register a new transistor structure, layout, and step information as the TEG information, and wherein a design rule related to the new transistor structure is stored in association with the new transistor structure.

6. The control system of automatically arranging a circuit layout on a substrate according to claim 2, wherein the coordinate information comprises information on a size of the substrate, the shape of the substrate, an implementable region of the circuit layout, and a number of mounted TEG blocks.

7. The control system of automatically arranging a circuit layout on a substrate according to claim 2, wherein the TEG map generation program is configured to automatically arrange TEGs that are automatically generated by the TEG generation program on the substrate to automatically generate a TEG map.

8. The control system of automatically arranging a circuit layout on a substrate according to claim 2, wherein the learning model comprises a first neural network and a second neural network, and wherein a plurality of TEG blocks is input to the learning model as inference data so that the learning model is able to judge which position in the substrate is suitable for TEG block arrangement.

9. The control system of automatically arranging a circuit layout on a substrate according to claim 8, wherein the first neural network comprises an input layer and a plurality of hidden layers, wherein the second neural network is configured to function as a fully-connected layer, wherein the first neural network is supplied with measurement data of a manufacturing apparatus as learning data, wherein the measurement data comprises the in-plane distribution of a plurality of manufacturing apparatuses, and wherein each piece of the measurement data is data measured in accordance with all the coordinates of a TEG block map.

10. A control system of automatically arranging a circuit layout on a substrate, wherein the control system comprises:

a processor, a memory device comprising a TEG generation program, a TEG map generation program, a learning model, and a database; and a display device configured to display data generated by the TEG map generation program, wherein the processor is configured to perform processing using at least one of the TEG generation program and the TEG map generation program, wherein the database comprises TEG information, coordinate information, property information, and step information, wherein the learning model comprises a step of learning measurement data comprising an in-plane distribution of a manufacturing apparatus, and wherein the learning model comprises a step of automatically arranging the circuit layout on the substrate by giving the circuit layout to the learning model.

* * * * *